United States Patent
Shimatou

(10) Patent No.: US 9,620,595 B2
(45) Date of Patent: Apr. 11, 2017

(54) SEMICONDUCTOR DEVICE

(71) Applicant: FUJI ELECTRIC CO., LTD., Kawasaki-shi (JP)

(72) Inventor: Takayuki Shimatou, Kawasaki (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/991,877

(22) Filed: Jan. 8, 2016

(65) Prior Publication Data

US 2016/0126314 A1  May 5, 2016

Related U.S. Application Data

(63) Continuation of application No. PCT/JP2014/078711, filed on Oct. 29, 2014.

(30) Foreign Application Priority Data

Jan. 16, 2014 (JP) ................... 2014-005880

(51) Int. Cl.

| | |
|---|---|
| *H01L 29/06* | (2006.01) |
| *H01L 29/10* | (2006.01) |
| *H01L 29/78* | (2006.01) |
| *H01L 29/08* | (2006.01) |
| *H01L 29/423* | (2006.01) |

(52) U.S. Cl.
CPC ...... *H01L 29/1095* (2013.01); *H01L 29/0634* (2013.01); *H01L 29/0649* (2013.01); *H01L 29/0865* (2013.01); *H01L 29/0882* (2013.01); *H01L 29/1037* (2013.01);

(Continued)

(58) Field of Classification Search
USPC ........................................................ 257/622
See application file for complete search history.

(56) References Cited

U.S. PATENT DOCUMENTS

| | | |
|---|---|---|
| 2005/0194638 A1 | 9/2005 | Kouzuki et al. |
| 2006/0267092 A1 | 11/2006 | Jun et al. |

(Continued)

FOREIGN PATENT DOCUMENTS

| | | |
|---|---|---|
| EP | 2124257 A1 | 11/2009 |
| FR | 2768858 A1 | 3/1999 |

(Continued)

*Primary Examiner* — Dale E Page
*Assistant Examiner* — Wilner Jean Baptiste
(74) *Attorney, Agent, or Firm* — Rabin & Berdo, P.C.

(57) ABSTRACT

A gate pad electrode and a source electrode are disposed, separately from one another, on the front surface of a super junction semiconductor substrate. A MOS gate structure formed of n source regions, p channel regions, p contact regions, a gate oxide film, and polysilicon gate electrodes is formed immediately below the source electrode. The p well regions are formed immediately below the gate pad electrode. The p channel regions are linked to the p well regions via extension portions. By making the width of the p well regions wider than the width of the p channel regions, it is possible to reduce a voltage drop caused by a reverse recovery current generated in a reverse recovery process of a body diode. Breakdown of a portion of a gate insulating film immediately below the center of the gate pad electrode and breakdown of the semiconductor device are thus prevented

20 Claims, 14 Drawing Sheets

(52) U.S. Cl.
CPC ........ *H01L 29/42356* (2013.01); *H01L 29/78* (2013.01); *H01L 29/7802* (2013.01)

(56) References Cited

U.S. PATENT DOCUMENTS

| | | |
|---|---|---|
| 2007/0262390 A1 | 11/2007 | Ishida et al. |
| 2008/0079079 A1 | 4/2008 | Noguchi et al. |
| 2010/0148268 A1 | 6/2010 | Noguchi et al. |
| 2011/0180909 A1* | 7/2011 | Yoshikawa ......... H01L 29/0634 257/622 |
| 2012/0205669 A1 | 8/2012 | Miura et al. |
| 2013/0020587 A1 | 1/2013 | Hino et al. |
| 2013/0037852 A1 | 2/2013 | Tamaki |

FOREIGN PATENT DOCUMENTS

| | | |
|---|---|---|
| JP | 04035069 A | 2/1992 |
| JP | H05-343692 A | 12/1993 |
| JP | 2005-251905 A | 9/2005 |
| JP | 2007-305751 A | 11/2007 |
| JP | 2008-085188 A | 4/2008 |
| JP | 4962664 B2 | 6/2012 |
| JP | 4962665 B2 | 6/2012 |
| JP | 2012-164879 A | 8/2012 |
| JP | 2013-251513 A | 12/2013 |

\* cited by examiner

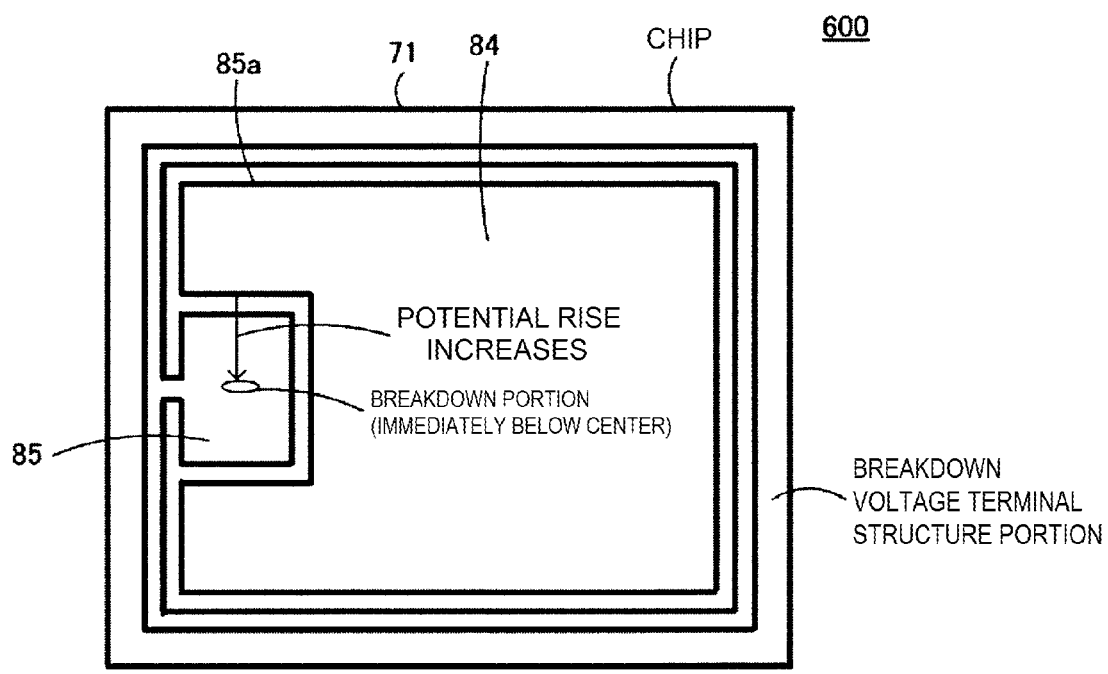

SEMICONDUCTOR DEVICE

CROSS-REFERENCE TO RELATED APPLICATIONS

This non-provisional application for a U.S. patent is a Continuation of International Application PCT/JP2014/078711 filed Oct. 29, 2014, which claims priority from JP PA 2014-005880 filed Jan. 16, 2014, the entire contents of both of which are hereby incorporated by reference.

BACKGROUND OF THE INVENTION

1. Field of the Invention

The present invention relates to a semiconductor device.

2. Background of the Related Art

Heretofore, as a MOS (metal oxide semiconductor) type semiconductor device, an insulated gate field effect transistor (MOSFET: Metal Oxide Semiconductor Field Effect Transistor) is publicly known. A description will be given of a heretofore known MOS type semiconductor device with a planar gate MOSFET, wherein a MOS gate (an insulated gate formed of a metal oxide semiconductor) is provided on a semiconductor substrate in a planar shape, as an example. FIG. 7 illustrates plan views showing a configuration of a heretofore known planar gate MOSFET 500. FIG. 8 illustrates sectional views showing sectional structures along the section line X1-X1, section line X2-X2, and section line X3-X3 of FIG. 7B.

FIG. 7A shows a plan view layout of a source electrode 61, a gate pad electrode 62, and a gate runner 62a, which are disposed on the front surface of an n semiconductor substrate (a semiconductor chip) 51, and FIG. 7B shows in enlarged dimension the portion defined by the rectangular frame B of FIG. 7A. In FIG. 7B, a gate oxide film 55, a polysilicon gate electrode 56, and an interlayer insulating film 59, which are disposed on the front surface of the n semiconductor substrate 51, are omitted from the illustration, and contact holes 60, the source electrode 61, and the gate pad electrode 62 are shown by the dotted lines. FIG. 8A shows a sectional structure along the section line X1-X1 of FIG. 7B. FIG. 8B shows a sectional structure along the section line X2-X2 of FIG. 7B. FIG. 8C shows a sectional structure along the section line X3-X3 of FIG. 7B.

As shown in FIG. 7A, the planar gate MOSFET 500 includes the gate pad electrode 62 and source electrode 61 on the front surface of the n semiconductor substrate 51. The gate pad electrode 62 is disposed on the chip outer peripheral side of an active region. The source electrode 61 is disposed substantially all over the active region except in the portion in which the gate pad electrode 62 is disposed, and surrounds, for example, three sides of the substantially rectangular gate pad electrode 62. The gate runner 62a disposed so as to enclose the perimeter of the source electrode 61 is connected to the gate pad electrode 62. A breakdown voltage terminal structure portion is disposed in the outermost periphery (chip outermost periphery) of the planar gate MOSFET 500 so as to surround the perimeter of the active region. The active region is a region through which current flows when in on-state. The breakdown voltage terminal structure portion is a region which relaxes the substrate front surface side electric field of an n drift region 51a and maintains a breakdown voltage.

FIG. 8A shows a sectional structure along the section line X1-X1 which sections the gate pad electrode 62 in a direction (the lateral direction of the drawing) perpendicular to one side of the gate pad electrode 62 of FIG. 7B which is not opposed to the source electrode 61. As shown in FIG. 8A, one p well region 63 is formed in a surface layer of the front surface of the n semiconductor substrate 51 which forms the n drift region 51a, immediately below the gate pad electrode 62 (on the n drift region 51a side). One p high concentration region 64 is formed, in a surface layer on the front surface side, on the surface of the p well region 63. The polysilicon gate electrode 56 is disposed via the gate oxide film 55 on the front surface of the n semiconductor substrate 51. The interlayer insulating film 59 is formed on the surface of the polysilicon gate electrode 56, and furthermore, the gate pad electrode 62 is disposed on the surface of the interlayer insulating film 59.

The polysilicon gate electrode 56 is connected to the gate pad electrode 62 on the interlayer insulating film 59 by wires omitted from the illustration. An n drain region 57 is disposed in a surface layer of the rear surface of the n semiconductor substrate 51. Also, a drain electrode 58 connected to the n drain region 57 is disposed on the rear surface of the n semiconductor substrate 51. A portion of the n semiconductor substrate 51 is the n drift region 51a sandwiched between the p well region 63 and the n drain region 57. A pn junction 65a is formed at the interface between the p well region 63 and the n drift region 51a. A body diode 65 which is a parasitic diode is configured of the p high concentration region 64, p well region 63, n drift region 51a, and n drain region 57.

FIG. 8B shows a sectional structure along the section line X2-X2 which sections the portion of FIG. 7B between the gate pad electrode 62 and the source electrode 61 parallel to the section line X1-X1. The portion of FIG. 7B between the gate pad electrode 62 and the source electrode 61 is the portion sandwiched between the dotted line indicating the outer periphery of the gate pad electrode 62 and the dotted line indicating the outer periphery of the source electrode 61. As shown in FIG. 8B, a plurality of separate extension portions 52a are disposed in a surface layer of the n semiconductor substrate 51 immediately below the portion between the gate pad electrode 62 and the source electrode 61. Extension portions 54a are each selectively disposed, in a surface layer on the substrate front surface side, inside the extension portion 52a. The extension portions 52a are portions extending on the gate pad electrode 62 side of p channel regions 52, to be described hereafter, which are disposed immediately below the source electrode 61. The extension portions 54a are portions extending on the gate pad electrode 62 side of p contact regions 54, to be described hereafter, which are disposed immediately below the source electrode 61.

The polysilicon gate electrodes 56 are each disposed via the gate oxide film 55 so as to extend between adjacent extension portion 52a. The interlayer insulating film 59 is disposed on the surfaces of the polysilicon gate electrodes 56, and over surfaces of the extension portions 52a of the p channel regions 52, and of the extension portion 54a of the p contact regions 54, exposed between the polysilicon gate electrodes 56. The n drain region 57 and the drain electrode 58 are disposed on the rear surface side of the n semiconductor substrate 51, in the same way as immediately below the gate pad electrode 62. The pn junction 65a which is a parasitic diode is formed at the interface between the extension portion 52a of the p channel region 52 and the n drift region 51a. The body diode 65 is configured of the extension portions 54a of the p contact regions 54, the extension portions 52a of the p channel regions 52, the n drift region 51a, and the n drain region 57.

FIG. 8C shows a sectional structure along the section line X3-X3 which sections a portion on the chip outer peripheral side of the source electrode 61 of FIG. 7B parallel to the section line X1-X1. As shown in FIG. 8C, a plurality of the separate p channel regions 52 are disposed in a surface layer of the n semiconductor substrate 51, immediately below the source electrode 61. n source regions 53 and the p contact region 54 are selectively formed, in a surface layer on the substrate front surface side, inside each p channel region 52. The p contact regions 54 are each disposed on the central side of the p channel region 52 relative to the n source regions 53 so as to make contact with the n source regions 53. The polysilicon gate electrodes 56 are each disposed via the gate oxide film 55, on the surfaces of portions of adjacent p channel regions 52, each sandwiched between the n source region 53 and the n semiconductor substrate 51, so as to extend between the n source regions 53 disposed in the adjacent p channel regions 52.

The interlayer insulating film 59 is disposed on the surfaces of the polysilicon gate electrodes 56. The source electrode 61 is disposed on the surface of the interlayer insulating film 59. The contact holes 60 are formed in the interlayer insulating film 59, and the p contact regions 54 and the n source regions 53 are electrically connected to the source electrode 61 via the contact holes 60. The n drain region 57 and the drain electrode 58 are disposed on the rear surface side of the n semiconductor substrate 51, in the same way as immediately below the gate pad electrode 62. The pn junction 65a is formed at the interface between the p channel region 52 and the n drift region 51a. The body diode 65, which is a parasitic diode, is configured of the p contact regions 54, p channel regions 52, n drift region 51a, and n drain region 57.

As shown in FIG. 7B, the plurality of p channel regions 52 immediately below the source electrode 61 are disposed in a plan view layout of stripes. Two n source regions 53 which are, for example, in straight lines are separately disposed, parallel to a direction in which the p channel regions 52 extend in stripes, inside each p channel region 52. The p contact regions 54 are each disposed between the separately disposed n source regions 53 so as to make contact with the respective n source regions 53. The p channel regions 52 and the p contact regions 54 are linked to the p well region 63 and p high concentration region 64 immediately below the gate pad electrode 62, via extension portions 52a and 54a, respectively.

The p channel regions 52, the extension portions 52a of the p channel regions 52, and the p well region 63 are formed by ion implantation using the same mask at the same impurity concentration and to the same diffusion depth. Also, the p contact regions 54, the extension portions 54a of the p contact regions 54, and the p high concentration region 64 are formed by ion implantation using the same mask at the same impurity concentration and to the same diffusion depth.

In this way, the one p well region 63 formed immediately below the gate pad electrode 62 is linked to the plurality of p channel regions 52 on the underside of the source electrode 61. By so doing, when a positive voltage is applied between the drain and source of the planar gate MOSFET 500, a depletion layer spreading from the pn junction 65a between the p channel regions 52 and p well region 63 and the n drift region 51a spreads uniformly immediately below the gate pad electrode 62. Therefore, it is possible to suppress an electric field concentration immediately below the gate pad electrode 62, and thus secure a high breakdown voltage.

A description will be given of a reverse recovery operation (a motion of excessive holes 67 and electrons 68 in a reverse recovery process) of the body diode 65 of the planar gate MOSFET 500. FIG. 9 illustrates explanatory diagrams showing a reverse recovery operation of the body diode 65 of the planar gate MOSFET 500 of FIG. 8. FIGS. 9A and 9B show a case in which a forward current If flows through the body diode 65, and FIGS. 9C and 9D show a case in which a reverse current Ir flows through the body diode 65. Also, FIGS. 9A and 9C show a motion of carriers immediately below the gate pad electrode 62, and FIGS. 9B and 9D show a motion of carriers immediately below the source electrode 61.

The body diode 65, which is a parasitic diode, is configured of the p high concentration region 64, p well region 63, n drift region 51a, and n drift region 57, as heretofore described, immediately below the gate pad electrode 62 shown in FIGS. 9A and 9C. The body diode 65 which is a parasitic diode is configured of the p contact regions 54, p channel regions 52, n drift region 51a, and n drain region 57, as heretofore described, immediately below the source electrode 61 shown in FIGS. 9B and 9D.

As shown in FIGS. 9A and 9B, when a negative voltage is applied between the drain and source of the planar gate MOSFET 500, the forward current If flows through the body diode 65. Excess holes 67 and excess electrons 68 are stored in the n drift region 51a due to the forward current If. Meanwhile, as shown in FIGS. 9C and 9D, when the body diode 65 makes a transition to the reverse recovery process, the excess holes 67 flow into the p channel regions 52 and p well region 63, and the excess electrons 68 flow into the n drain region 57, as the reverse current Ir. As a result of this, the condition in which carriers are excessively stored is eliminated, and the breakdown voltage of the planar gate MOSFET 500 is maintained.

In this way, when the reverse current Ir flows through the body diode 65, the reverse current Ir also flows into the p well region 63 and p high concentration region 64 immediately below the gate pad electrode 62. Also, the reverse current Ir having flowed into the p well region 63 and p high concentration region 64 flows from the p well region 63 and p high concentration region 64 into the p channel regions 52 and p contact regions 54, and furthermore, flows into the source electrode 61 by way of the contact holes 60. The potential of a portion of the p well region 63 immediately below the center of the gate pad electrode 62 rises due to resistance Rp (refer to FIG. 7B) in the current path of the reverse current Ir.

The potential of the portion of the p well region 63 immediately below the center of the gate pad electrode 62 rises due to the reverse current Ir flowing through the body diode 65 in this way, but the p well region 63 is formed as one region all over immediately below the gate pad electrode 62. Therefore, the surface area of the pn junction 65a of the body diode 65 formed immediately below the gate pad electrode 62 is wide, and the resistance Rp of the current path through which the excess holes 67 flow from the p contact regions 54 into the source electrode 61 is small. Consequently, a rise in the potential of the portion of the p well region 63 immediately below the center of the gate pad electrode 62 is small.

However, as the p well region 63 and the p high concentration region 64 are disposed as one region all over immediately below the gate pad electrode 62, a portion partly low in resistance occurs when the impurity concentration of the p well region 63 and p high concentration region 64 varies in their respective planes. Current (the holes 67) flows into the portion low in resistance from around, and flows into the p channel regions 52 linked to the portion low in resistance. Therefore, there is fear that the potential of the p well region 63 and p high concentration region 64 rises, and that a large voltage is applied to the gate oxide film 55 sandwiched between the p well region 63 and the polysilicon gate electrode 56, thus causing breakdown of the gate oxide film 55.

When using the planar gate MOSFET 500 as a switch, the body diode 65 functions as a free wheeling diode (FWD). FIG. 10 is an explanatory diagram showing an operation of an inverter circuit to which an inductive load M is connected. FIG. 10 shows a reflux current Io flowing through the inverter circuit in an operation of the inverter circuit. A description will be given, as an example, of a three-phase output inverter circuit wherein half bridge circuits, each having switches M1 and M2 connected in series, are connected in parallel between terminals P and N. As the switches M1 and M2, for example, the heretofore described planar gate MOSFETs 500 are used. An inductive load M is connected between the switches M1 and M2 of the half bridge circuits. The free wheeling diode FWD is connected in parallel to each switch M1 and M2.

As shown in FIG. 10, when the switch M1 is turned on in a condition in which the reflux current Io is flowing through the inductive load M and free wheeling diode FWD, the switch M1 is turned on, and a current IM1 flows from the switch M1 toward the switch M2. The current IM1 flows so as to cancel out the reflux current Io which is already flowing through the free wheeling diode FWD and body diode 65, thus bringing the free wheeling diode FWD and body diode 65 into off-state. In FIG. 10, the switch M1 is an upper arm MOSFET, the switch M2 is a lower arm MOSFET, the current IM1 is the current of the switch M1, the terminal P is the positive terminal of the inverter circuit, and the terminal N is the negative terminal of the inverter circuit. The forward current If shown in FIG. 9A is one portion of the reflux current Io flowing through the inductive load M and free wheeling diode FWD in an operation of the inverter circuit to which the inductive load M is connected, and is the forward current If flowing through the body diode 65.

Next, a description will be given, as another example of the heretofore known MOS semiconductor device, of a MOSFET of a super junction (SJ) structure (hereafter referred to as a super junction MOSFET) with a drift layer as a parallel pn layer wherein n-type regions and p-type regions, which are made higher in impurity concentration, are alternately disposed. FIG. 11 illustrates plan views showing a configuration of a heretofore known super junction MOSFET 600. FIG. 12 illustrates sectional views showing sectional structures along the section line X1-X-1, section line X2-X2, and section line X3-X3 of FIG. 11B. FIG. 11A shows a plan view layout of a source electrode 84, a gate pad electrode 85, and a gate runner 85a, which are disposed on the front surface of a semiconductor substrate (hereafter referred to as a super junction semiconductor substrate (a semiconductor chip)) 71, and shows, by the dotted lines, parallel pn layers (pn parallel columns) 74 wherein n-type columns (n columns) and p-type columns (p columns) are alternately disposed. FIG. 11B shows in enlarged dimension the portion defined by the rectangular frame B of FIG. 11A. In FIG. 11B, gate oxide films 77, polysilicon gate electrodes 78, and an interlayer insulating film 82, which are disposed on the front surface of the super junction semiconductor substrate 71, are omitted from the illustration, and contact holes 83, the source electrode 84, and the gate pad electrode 85 are shown by the dotted lines.

FIG. 12(a) shows a sectional structure along the section line X1-X1 of FIG. 11B. FIG. 12(b) shows a sectional structure along the section line X2-X2 of FIG. 11B. FIG. 12(c) shows a sectional structure along the section line X3-X3 of FIG. 11B. As shown in FIG. 11A, the super junction MOSFET 600 includes the gate pad electrode 85 and source electrode 84 on the front surface of the super junction semiconductor substrate 71. The gate runner 85a disposed so as to enclose the perimeter of the source electrode 84 is connected to the gate pad electrode 85. The plan view layout of the gate pad electrode 85, source electrode 84, gate runner 85a, and breakdown voltage terminal structure portion is the same as that of the gate pad electrode 62, source electrode 61, gate runner 62a, and breakdown voltage terminal portion of the planar gate MOSFET 500 shown in FIG. 7A.

FIG. 12(a) shows a sectional structure along the section line X1-X1 which sections the gate pad electrode 85 in a direction (the lateral direction of the drawing) perpendicular to one side of the gate pad electrode 85 of FIG. 11B which is not opposed to the source electrode 84. As shown in FIG. 12(a), the pn parallel columns 74 wherein p columns 72 and n columns 73 are alternately disposed are disposed on a first n layer 71 (on a surface opposite to the side of an n drain region 80 to be described hereafter), immediately below the gate pad electrode 85 (on the pn column 74 side). A second n layer 71b is disposed on the pn parallel columns 74. p well regions 86 which pass through the second n layer 71b and reach the p columns 72 of the pn parallel columns 74 are disposed in positions inside the second n layer 71b opposite in a depth direction to the respective p columns 72 of the pn parallel columns 74. The p well regions 86 have the function of maintaining the breakdown voltage immediately below the gate pad electrode 85.

The p high concentration regions 87 are each selectively disposed, in a surface layer on the substrate front surface side, inside the p well region 86. The polysilicon gate electrodes 78 are each disposed via the gate oxide film 77 so as to extend between adjacent p well regions 86. The interlayer insulating film 82 is disposed on the surfaces of the polysilicon gate electrodes 78, and over surfaces of the p well regions 86 and p high concentration regions 87, each exposed between the polysilicon gate electrodes 78. The gate pad electrode 85 is disposed on the surface of the interlayer insulating film 82. The polysilicon gate electrodes 78 are electrically connected to the gate pad electrode 85 by wires omitted from the illustration. The n drain region 80 is disposed on a surface of the first n layer 71a opposite to the pn parallel column 74 side. The super junction semiconductor substrate 71 is formed by stacking the n drain region 80, first n layer 71a, pn parallel columns 74, and second n layer 71b in order from the drain side. A drain electrode 81 is disposed connected to the n drain region 80.

A pn junction 93 is formed at the interface (the portion shown by the solid line) between the p region of the p well region 86 and p column 72 and the n region of the second n layer 71b, n column 73, and first n layer 71a. A body diode 91 is configured of the p high concentration regions 87, p well regions 86, p columns 72, first n layer 71a, and n drain region 80.

FIG. 12(b) shows a sectional view along the section line X2-X2 which sections the portion between the gate pad electrode 85 and source electrode 84 of FIG. 11B parallel to the section line X1-X1. The portion between the gate pad electrode 85 and source electrode 84 of FIG. 11B is the portion sandwiched between the dotted line indicating the outer periphery of the gate pad electrode 85 and the dotted line indicating the outer periphery of the source electrode 84. As shown in FIG. 12(b), the pn parallel columns 74 and the second n layer 71b are disposed in order on the first n layer 71a, immediately below the portion between the gate pad electrode 85 and the source electrode 84, in the same way as immediately below the gate pad electrode 85. Extension portions 75a, which pass through the second n layer 71b and reach the p columns 72 of the pn parallel columns 74, are disposed in positions inside the second n layer 71b opposite in the depth direction to the respective p columns 72 of the pn parallel columns 74.

Extension portions 79a are each selectively disposed, in a surface layer on the substrate front surface side, inside the extension portion 75a. The extension portions 75a are portions, extending on the gate pad electrode 85 side, of p channel regions 75, to be described hereafter, which are disposed immediately below the source electrode 84. The extension portions 79a are portions, extending on the gate pad electrode 85 side, of p contact regions 79, to be described hereafter, which are disposed immediately below the source electrode 84. The polysilicon gate electrodes 78 are each disposed via the gate oxide film 77 so as to extend between adjacent extension portions 75a. The interlayer insulating film 82 is disposed on the surfaces of the polysilicon gate electrodes 78, and over surfaces of the extension portions 75a of the p channel regions 75 and the extension portions 79a of the p contact regions 79, each exposed between the polysilicon gate electrodes 78. The n drain region 80 and the drain electrode 81 are disposed on the side of the first n layer 71a opposite to the pn parallel column 74 side, in the same way as immediately below the gate pad electrode 85.

A pn junction 93 is formed at the interface (the portion shown by the thick line) between the p region of the extension portion 75a of the p channel region 75 and the p column 72 and the n region of the second n layer 71b, n column 73, and first n layer 71a. The body diode 91 is configured of the extension portions 79a of the p contact regions 79, the extension portions 75a of the p channel regions 75, the p columns 72, the first n layer 71a, and the n drain region 80.

FIG. 12(c) shows a sectional structure along the section line X3-X3 which sections a portion on the chip outer peripheral side of the source electrode 84 of FIG. 11B parallel to the section line X1-X1. As shown in FIG. 12(c), the pn parallel columns 74 and the second n layer 71b are disposed in order on the first n layer 71a, immediately below the source electrode 84, in the same way as immediately below the gate pad electrode 85. The p channel regions 75, which pass through the second n layer 71b and reach the p columns 72 of the pn parallel columns 74, are disposed in positions inside the second n layer 71b opposite in the depth direction to the respective p columns 72 of the pn parallel columns 74. The n source regions 76 and the p contact region 79 are selectively formed, in a surface layer on the substrate front surface side, inside each p channel region 75. The p contact regions 79 are each disposed on the central side of the p channel region 75 relative to the n source regions 76 so as to make contact with the n source regions 76.

The polysilicon gate electrodes 78 are each disposed via the gate oxide film 77, on the surfaces of portions of adjacent p channel regions 75, each sandwiched between the n source region 76 and the second n layer 71b, so as to extend between the n source regions 76 disposed in the adjacent p channel regions 75. The interlayer insulating film 82 is disposed on the surfaces of the polysilicon gate electrodes 78. The source electrode 84 is disposed on the surface of the interlayer insulating film 82. The contact holes 83 are formed in the interlayer insulating film 82, and the p contact regions 79 and the n source regions 76 are electrically connected to the source electrode 84 via the contact holes 83. The n drain region 80 and the drain electrode 81 are disposed on the side of the first n layer 71a opposite to the pn parallel column 74 side, in the same way as immediately below the gate pad electrode 85.

A pn junction 92 is formed at the interface (the portion shown by the thick line) between the p region of the p channel region 75 and p column 72 and the n region of the second n layer 71b, n column 73, and first n layer 71a. The body diode 91 is configured of the p contact regions 79, p channel regions 75, p columns 72, first n layer 71a, and n drain region 80.

The pn parallel column 74 disposed immediately below the gate pad electrode 85, the pn parallel column 74 disposed immediately below the portion between the gate pad electrode 85 and the source electrode 84, and the pn parallel column 74 disposed immediately below the source electrode 84 are integrally formed. The pn parallel columns 74, having a plan view shape of stripes, are the same in impurity concentration, shape, and dimension, and are formed at the same time. That is, the pn parallel columns 74 are disposed in a plan view layout of stripes wherein the p column 72 and the n column 73 are alternately disposed, as shown in FIG. 11A.

Also, as shown in FIG. 11B, the plan view layout of the p channel regions 75, n source regions 76, and p contact regions 79 is the same as that of the p channel regions 52, n source regions 53, and p contact regions 54 of the planar gate MOSFET 500 shown in FIG. 7B. The p well regions 86 immediately below the gate pad electrode 85 and the p channel regions 75 immediately below the source electrode 84 are linked to each other via the extension portions 75a of the p channel regions 75. The p well regions 86, being disposed in a plan view layout of stripes parallel to the p channel regions 75, are the same in impurity concentration, shape, and dimension, and are formed at the same time as the p channel regions 75. Also, the p high concentration regions 87 immediately below the gate pad electrode 85 and the p contact regions 79 immediately below the source electrode 84 are linked to each other via the extension portions 79a of the p contact regions 79. The p high concentration regions 87, being disposed in a plan view layout of stripes parallel to the p contact regions 79, are the same in impurity concentration, shape, and dimension, and are formed at the same time as the p contact regions 79.

In this way, in the super junction MOSFET 600, in order to achieve the uniformity in the in-plane breakdown voltage of the chip, the pn parallel columns 74 are also formed immediately below the gate pad electrode 85 in the same way as immediately below the source electrode 84. The p well regions 86, immediately below the gate pad electrode 85, to be linked to the p channel regions 75 immediately below the source electrode 84, although having a shape different from the p channel regions 75, hardly affect the in-plane breakdown voltage of the chip.

Also, the super junction MOSFET 600 is different from the planar gate MOSFET 500 shown in FIG. 7 in that the p well regions 86 and the p high concentration regions 87 are disposed in a plan view layout of stripes, rather than disposing one p region all over immediately below the gate pad electrode 85. Therefore, the p well regions 86 and p high concentration regions 87 of straight lines configuring the stripes are smaller in surface area, respectively, than the p well regions 63 and p high concentration regions 64 immediately below the gate pad electrode 62 of the planar gate MOSFET 500 of FIG. 7. Consequently, a rise in the potential of the p well regions 86 and p high concentration regions 87 is suppressed even though the p well regions 86 and the p high concentration regions 87 vary in impurity concentration, thus forming a portion partly low in resistance, and current (the holes 67 acting as the reverse current Ir to be described hereafter) flows into the portion low in resistance from around. Therefore, a voltage applied to the gate oxide film 77 sandwiched between the p well region 86 and the polysilicon gate electrode 78 is small, and breakdown of the gate oxide film 77 due to the variation in impurity concentration is suppressed.

Also, in the super junction MOSFET 600, the area of the pn junction 92 (body diode 91) immediately below the gate pad electrode 85 is large compared with the area of the pn junction 65a (body diode 65) immediately below the gate pad electrode 62 of the planar gate MOSFET 500. Therefore, in a reverse recovery process of the body diode 91, the amount of holes 67 flowing into the p channel regions 75 and p contact regions 79 by way of the p well regions 86 and p high concentration regions 87 immediately below the gate pad electrode 85 is large compared with in the planar gate MOSFET 500. However, the holes 67 flow, comparatively evenly dispersed, through the p well regions 86 and p high concentration regions 87, and do not flow concentrated in a specific p well region 86 or p high concentration region 87 which is low in resistance.

However, as the p well regions 86 and p high concentration regions 87 of the super junction MOSFET 600 are disposed in stripes, the resistance R of the current path of current (the holes 67) is large (refer to FIG. 11B). Therefore, there is fear that a rise in the potential of a portion of the p well region 86 of the super junction MOSFET 600 immediately below the center of the gate pad electrode 85 increases, thus causing breakdown of the gate oxide film 77.

A description will be given of a motion of the holes 67 in the reverse recovery process of the body diode 91 of the super junction MOSFET 600. FIG. 13 illustrates explanatory diagrams showing a reverse recovery operation of the body diode 91 of the super junction MOSFET 600 of FIG. 12. FIGS. 13A and 13B show a case in which the forward current If flows through the body diode 91, and FIGS. 13C and 13D show a case in which the reverse current Ir flows through the body diode 91. Also, FIGS. 13A and 13C show a motion of carriers immediately below the gate pad electrode 85, and FIGS. 13B and 13D show a motion of carriers immediately below the source electrode 84.

As shown in FIGS. 13A and 13B, when the body diode 91 of the super junction MOSFET 600 is forward biased, and the forward current If flows through the body diode 91, excess holes 67 and electrons 68 are stored in the p columns 72 and n columns 73. Meanwhile, as shown in FIGS. 13C and 13D, when the body diode 91 makes a transition to the reverse recovery process, the excess holes 67 flow into the p well regions 86 and p channel regions 75, and the excess electrons 68 flow into the n drain region 80, as the reverse current Ir. The holes 67 flowing through the p well regions 86 and p high concentration regions 87 flow into the source electrode 84 by way of the p channel regions 75 and p contact regions 79, and the holes 67 having flowed into the p channel regions 75 flow into the source electrode 84 by way of the contact holes 83.

JP-A-2012-164879 (PTL 1) discloses a device having an element region, a conductive region, and an outer peripheral region, which form a trench structure MOSFET, wherein an outer peripheral end of the element region has outwardly angled corners in the vicinity of the conductive region, thereby improving breakdown withstand when in reverse recovery while securing an element breakdown voltage.

Japanese Patent No. 4,962,665 (PTL 2) discloses a device wherein p contact regions to which p-type impurities are added at a high concentration are provided on the surfaces of p well regions immediately below a gate pad electrode, thereby preventing breakdown of a gate insulating film.

Japanese Patent No. 4,962,664 (PTL 3) discloses a device wherein the p-type impurity concentration of a surface layer portion is increased by additional ion implantation to enhance the conductivity of p well regions below a gate pad electrode, thereby preventing breakdown of a gate insulating film.

JP-A-5-343692 (PTL 4) discloses a device wherein trenches are formed in portions, immediately below a source electrode, of p well regions provided from immediately below a gate pad electrode to immediately below the source electrode, and are filled with a tungsten layer, and the tungsten layer and the source electrode are connected, thereby preventing breakdown of a gate insulating film.

That is, in PTLs 2 to 4, the p well regions disposed immediately below the gate pad electrode are electrically connected to an end portion of the source electrode disposed around the gate pad electrode, and excess holes having flowed into the p well regions when a body diode is reversely recovered are extracted, thereby preventing breakdown of the gate insulating film immediately below the gate pad electrode.

In the reverse recovery process of the body diode 91 of the super junction MOSFET 600 shown in FIG. 13, a voltage of a size computed by the product of a current (the holes 67) flowing through the p well regions 86 immediately below the gate pad electrode 85 and the resistance of the current path, through which the current flows, is generated. When the potential of the source electrode 84 is made a reference, the voltage generated in the reverse recovery process of the body diode 91 is highest in the portion of the p well region 86 immediately below the center of the gate pad electrode 85. Also, the voltage generated in the reverse recovery process of the body diode 91 is applied to the gate oxide film 77 on the surface of the portion sandwiched between adjacent p well regions 86 disposed immediately below the gate pad electrode 85, and to the polysilicon gate electrode 78 disposed on the gate oxide film 77. Furthermore, as a negative gate voltage (for example, on the order of −10V) applied to the polysilicon gate electrode 78 is added, in addition to the voltage generated in the reverse recovery process of the body diode 91, a high voltage is applied to the gate oxide film 77.

In this way, when the electric field inside the gate oxide film 77 exceeds the breakdown strength of the gate oxide film 77 by a high voltage being applied to the gate oxide film 77, the gate oxide film 77 suffers breakdown. FIG. 14 illustrates explanatory diagrams showing a breakdown portion of the gate oxide film 77 when the body diode 91 of the heretofore known super junction MOSFET 600 of FIG. 13 is reversely recovered. As the voltage generated in the reverse recovery process of the body diode 91 is highest in the portion of the p well region 86 immediately below the center of the gate pad electrode 85, as heretofore described, the breakdown portion of the gate oxide film 77 is the portion immediately below the center of the gate pad electrode 85, as shown in FIG. 14. When the gate oxide film 77 suffers breakdown, the polysilicon gate electrode 78 and the p well region 86 are short-circuited, the gate and source of the super junction MOSFET 600 comes into a short circuit condition, meaning that the super junction MOSFET 600 fails to operate properly.

In order to solve the heretofore described problems of the heretofore known technologies, the invention has for its object to provide a semiconductor device which can prevent breakdown of the gate insulating film occurring in the reverse recovery process of the body diode.

SUMMARY OF INVENTION

In order to solve the heretofore described problems and achieve the object of the invention, a semiconductor device according to the invention has the following characteristics. pn parallel columns, wherein first-conductivity-type columns and second-conductivity-type columns are alternately disposed, are disposed, on a first principal surface of a first first-conductivity-type semiconductor layer, in a plan view layout of stripes extending in a direction horizontal to the first principal surface of the first first-conductivity-type semiconductor layer. A second first-conductivity-type semiconductor layer is disposed on surfaces of the pn parallel columns opposite to the first first-conductivity-type semiconductor layer side. Second-conductivity-type channel regions are disposed inside the second first-conductivity-type semiconductor layer, in a plan view layout of stripes extending in the direction horizontal to the first principal surface of the first first-conductivity-type semiconductor layer. The second-conductivity-type channel regions pass through the second first-conductivity-type semiconductor layer in a depth direction and make contact with the second-conductivity-type columns. Second-conductivity-type well regions are disposed inside the second first-conductivity-type semiconductor layer, in a plan view layout of stripes extending parallel to a first direction in which the second-conductivity-type channel regions extend in stripes. The second-conductivity-type well regions pass through the second first-conductivity-type semiconductor layer in the depth direction and make contact with the second-conductivity-type columns. One end portion in the first direction of each of the second-conductivity-type well regions is linked to one end portion in the first direction of the second-conductivity-type channel region. First-conductivity-type source regions are disposed inside each second-conductivity-type channel region. Second-conductivity-type contact regions are disposed, in a plan view shape of straight lines extending in the first direction, one on the inner side of the first-conductivity-type source regions inside each second-conductivity-type channel region. The second-conductivity-type contact regions each make contact with the first-conductivity-type source regions. Second-conductivity-type high concentration regions are disposed, one inside each second-conductivity-type well region, in a plan view shape of straight lines extending in the first direction. One end portion in the first direction of each of the second-conductivity-type high concentration regions is linked to one end portion in the first direction of the second-conductivity-type contact region. First gate electrodes are each disposed via a gate insulating film, over the second first-conductivity-type semiconductor layer and on the surfaces of portions of the second-conductivity-type channel regions, each sandwiched between the first-conductivity-type source region and the second first-conductivity-type semiconductor layer. An interlayer insulating film is disposed on the surfaces of the first gate electrodes. A source electrode is disposed on the interlayer insulating film. The source electrode is connected to the second-conductivity-type channel regions and first-conductivity-type source regions via contact holes of the interlayer insulating film. A gate pad electrode is disposed, separately from the source electrode, in a position on the interlayer insulating film opposite to the second-conductivity-type well regions and second-conductivity-type high concentration regions with the interlayer insulating film sandwiched in between. The gate pad electrode is electrically connected to the first gate electrodes. A first-conductivity-type drain region is disposed on a second principal surface of the first first-conductivity-type semiconductor layer. A drain electrode is connected to the first-conductivity-type drain region. A width of the second-conductivity-type well regions in a second direction perpendicular to the first direction is wider than a width in the second direction of the second-conductivity-type channel regions.

Also, the semiconductor device according to the invention, in the heretofore described aspect of the invention, further has the following characteristics. Second gate electrodes are each disposed, via the gate insulating film, on the surface of a portion of the second-conductivity-type well regions and second first-conductivity-type semiconductor layer sandwiched between adjacent second-conductivity-type high concentration regions. The interlayer insulating film is disposed on the surfaces of the second gate electrodes.

Also, the semiconductor device according to the invention, in the heretofore described aspect of the invention, further has the following characteristics. First second-conductivity-type extension regions and second second-conductivity-type extension regions are disposed between the source electrode and the gate pad electrode. The first second-conductivity-type extension regions, each formed of a portion of the second-conductivity-type channel region extended in the first direction, pass through the second first-conductivity-type semiconductor layer in the depth direction and make contact with the second-conductivity-type columns. The first second-conductivity-type extension regions, each making contact with one end portion in the first direction of the second-conductivity-type well region, link the second-conductivity-type channel regions and second-conductivity-type well regions. The second second-conductivity-type extension regions are each such that a portion of the second-conductivity-type contact region extended in the first direction is disposed inside the first second-conductivity-type extension region. The second second-conductivity-type extension regions, each making contact with one end portion in the first direction of the second-conductivity-type high concentration region, link the second-conductivity-type contact regions and second-conductivity-type high concentration regions. Third gate electrodes are each disposed, via the gate insulating film, on the surface of a portion of the first second-conductivity-type extension regions and second first-conductivity-type semiconductor layer sandwiched between adjacent second second-conductivity-type extension regions. The interlayer insulating film is disposed on the surfaces of the third gate electrodes. The third gate electrodes link the first gate electrodes and second gate electrodes.

Also, in order to solve the heretofore described problems and achieve the object of the invention, a semiconductor device according to the invention has the following characteristics. Second-conductivity-type channel regions are disposed, in a surface layer on a first principal surface of a first-conductivity-type drift layer, in a plan view layout of stripes extending in a direction horizontal to the first principal surface of the first-conductivity-type drift layer. Second-conductivity-type well regions are disposed, in the surface layer on the first principal surface of the first-conductivity-type drift layer, in a plan view layout of stripes extending parallel to a first direction in which the second-conductivity-type channel regions extend in stripes. One end portion in the first direction of each of the second-conductivity-type well regions is linked to one end portion in the first direction of the second-conductivity-type channel region. First-conductivity-type source regions are disposed inside each of the second-conductivity-type channel regions.

Second-conductivity-type contact regions are disposed, in a plan view shape of straight lines extending in the first direction, one on the inner side of the first-conductivity-type source regions inside each second-conductivity-type channel region. The second-conductivity-type contact regions each make contact with the first-conductivity-type source regions.

Second-conductivity-type high concentration regions are disposed, one inside each of the second-conductivity-type well region, in a plan view shape of straight lines extending in the first direction. One end portion in the first direction of each of the second-conductivity-type high concentration regions is linked to one end portion in the first direction of the second-conductivity-type contact region. First gate electrodes are each disposed, via a gate insulating film, on the surfaces of portions of the second-conductivity-type channel regions, each sandwiched between the first-conductivity-type source region and the first-conductivity-type drift layer. An interlayer insulating film is disposed on the surfaces of the first gate electrodes. A source electrode is disposed on the interlayer insulating film. The source electrode is connected to the second-conductivity-type channel regions and first-conductivity-type source regions via contact holes of the interlayer insulating film. A gate pad electrode which is disposed, separately from the source electrode, in a position on the interlayer insulating film opposite to the second-conductivity-type well regions and second-conductivity-type high concentration regions with the interlayer insulating film sandwiched in between. The gate pad electrode is electrically connected to the first gate electrodes. A first-conductivity-type drain region is disposed on a second principal surface of the first-conductivity-type drift layer. A drain electrode is connected to the first-conductivity-type drain region. A width of the second-conductivity-type well regions in a second direction perpendicular to the first direction is wider than a width in the second direction of the second-conductivity-type channel regions.

Also, the semiconductor device according to the invention, in the heretofore described aspect of the invention, further has the following characteristics. Second gate electrodes are each disposed, via the gate insulating film, on the surface of a portion of the second-conductivity-type well regions and first-conductivity-type drift layer sandwiched between adjacent second-conductivity-type high concentration regions. The interlayer insulating film is disposed on the surfaces of the second gate electrodes.

Also, the semiconductor device according to the invention, in the heretofore described aspect of the invention, further has the following characteristics. First second-conductivity-type extension regions and second second-conductivity-type extension regions are disposed between the source electrode and the gate pad electrode. The first second-conductivity-type extension regions are each formed of a portion of the second-conductivity-type channel region extended in the first direction. Each of the first second-conductivity-type extension regions makes contact with one end portion in the first direction of the second-conductivity-type well region and links the second-conductivity-type channel region and second-conductivity-type well region. The second second-conductivity-type extension regions are each such that a portion of the second-conductivity-type contact region extended in the first direction is disposed inside the first second-conductivity-type extension region. Each of the second second-conductivity-type extension regions makes contact with one end portion in the first direction of the second-conductivity-type high concentration region and links the second-conductivity-type contact region and second-conductivity-type high concentration region. Third electrodes are each disposed, via the gate insulating film, on the surface of a portion of the first second-conductivity-type extension regions and first-conductivity-type drift layer sandwiched between adjacent second second-conductivity-type extension regions. The interlayer insulating film is disposed on the surfaces of the third gate electrodes. The third gate electrodes link the first gate electrodes and second gate electrodes.

Also, the semiconductor device according to the invention, in the heretofore described aspect of the invention, is characterized in that a width in the second direction of the second-conductivity-type high concentration regions is wider than a width in the second direction of the second-conductivity-type contact regions.

Also, the semiconductor device according to the invention, in the heretofore described aspect of the invention, is characterized in that a width in the second direction of the second gate electrode is narrower than a width in the second direction of the first gate electrodes.

Also, the semiconductor device according to the invention, in the heretofore described aspect of the invention, is characterized in that the second gate electrode is disposed in the whole portion opposite to the gate pad electrode with the interlayer insulating film sandwiched in between.

Also, the semiconductor device according to the invention, in the heretofore described aspect of the invention, is characterized in that the second gate electrode is electrically isolated from the first gate electrode.

Also, the semiconductor device according to the invention, in the heretofore described aspect of the invention, is characterized in that the pn parallel columns are such that the first-conductivity-type columns and the second-conductivity-type columns are alternately disposed in a plan view shape of stripes parallel to the first direction.

According to the heretofore described aspects of the invention, it is possible, in the reverse recovery process of the body diode, to reduce a voltage applied to the portion of the second-conductivity-type well region immediately below the center of the gate pad electrode, which is highest in voltage. Therefore, it is possible to reduce a voltage applied to the gate insulating film immediately below the gate pad electrode.

According to the semiconductor device of the invention, the advantageous effect that it is possible to prevent breakdown of the gate insulating film occurring in the reverse recovery process of the body diode, is produced.

BRIEF DESCRIPTION OF DRAWINGS

FIG. 14 is an explanatory diagram showing a breakdown portion of a gate oxide film 77 when the body diode 91 of the heretofore known super junction MOSFET 600 of FIG. 13 is reversely recovered.

DETAILED DESCRIPTION OF THE INVENTION

Hereafter, a detailed description will be given, referring to the accompanying drawings, of preferred embodiments of a semiconductor device according to the invention. In the present specification and the accompanying drawings, n or p in layers and regions prefixed with n or p means respectively that electrons or holes are majority carriers. In the following description of the embodiments and the accompanying drawings, the same signs are given to like components, thus omitting a redundant description. In each of the following embodiments, a description will be given with a super junction MOSFET as an example, but the invention, not being limited to a MOSFET, can also be applied to, for example, an insulated gate bipolar transistor (IGBT).

Embodiment 1

Figure 1A:
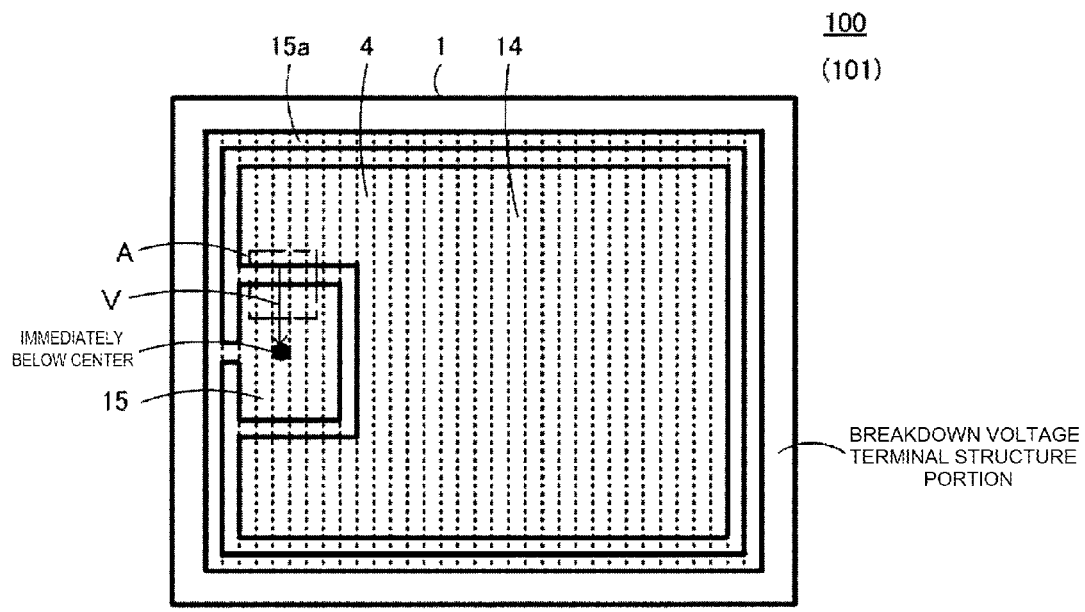
FIG. 1 includes FIGS. 1A and 1B which illustrate plan views showing a configuration of a semiconductor device 100 according to Embodiment 1 of the invention.
Figure 1B:
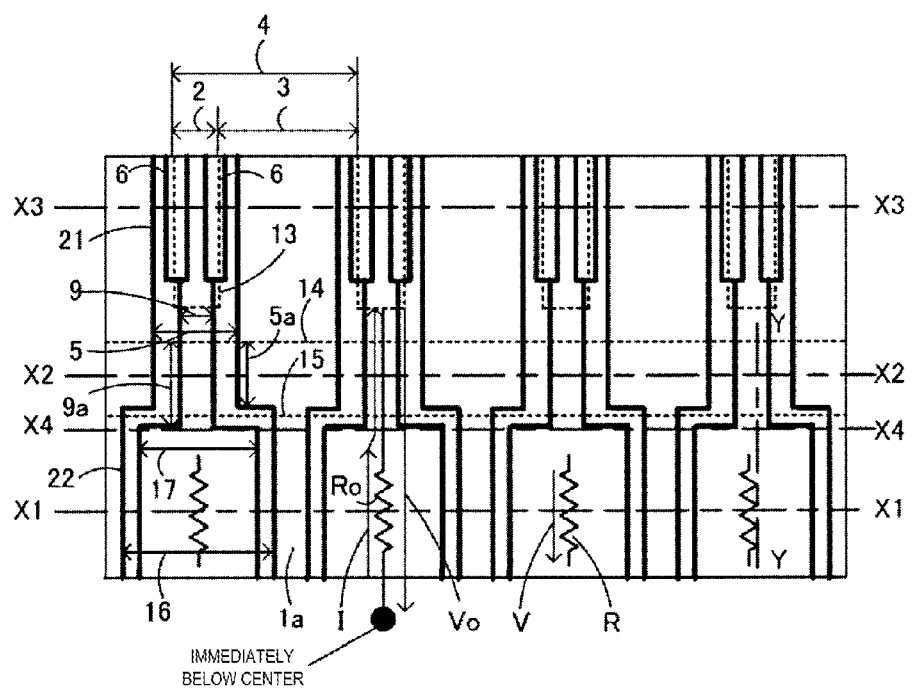

A description will be given of a semiconductor device according to Embodiment 1. FIG. 1 illustrates plan views showing a configuration of a semiconductor device 100 according to Embodiment 1 of the invention. FIG. 2 illustrates sectional views showing sectional structures along the section line X1-X1, section line X2-X2, and section line X3-X3 of FIG. 1B. FIG. 1A shows a plan view layout of a source electrode 14, a gate pad electrode 15, and a gate runner 15a, which are disposed on the front surface of a super junction semiconductor substrate (semiconductor chip) 1, and shows by the dotted lines a parallel pn layer (pn parallel columns) 4 wherein n-type regions (n columns) and p-type regions (p columns) are alternately disposed.

Figure 2A:
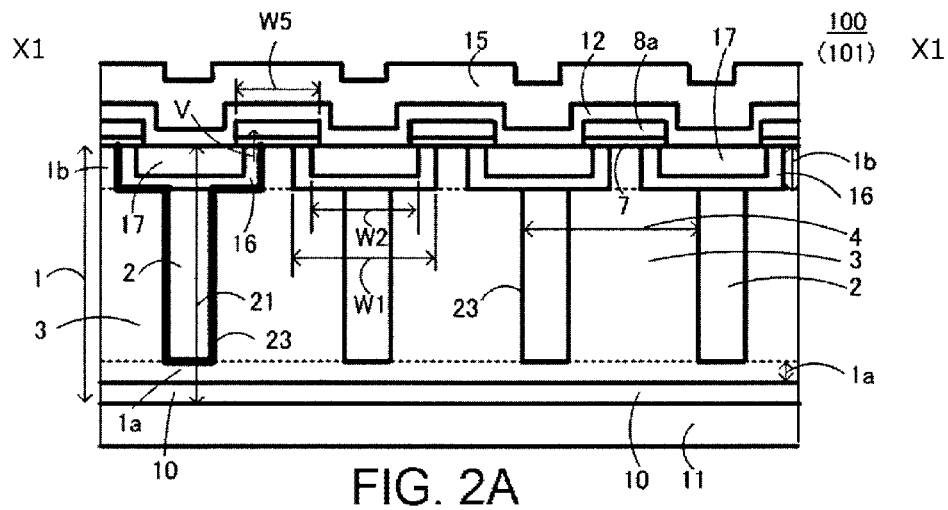
FIG. 2 includes FIGS. 2A, 2B, and 2C which illustrate sectional views showing sectional structures along the section line X1-X1, section line X2-X2, and section line X3-X3 of FIG. 1B, respectively.
Figure 2B:
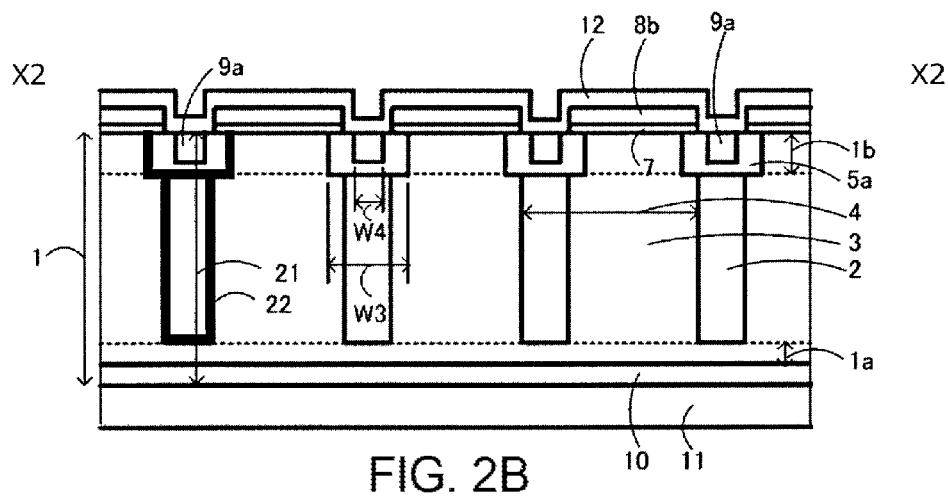
Figure 2C:
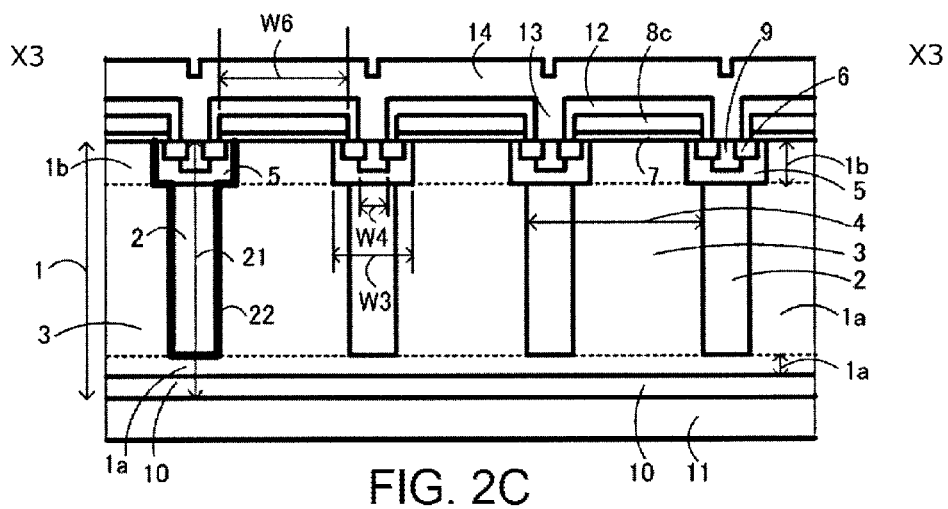

FIG. 1B shows in enlarged dimension a portion defined by the rectangular frame A of FIG. 1A. In FIG. 1B, a gate oxide film (a gate insulating film) 7, a polysilicon gate electrode 8, and an interlayer insulating film 12, which are disposed on the front surface of the super junction semiconductor substrate 1, are omitted from the illustration, and contact holes 13, the source electrode 14, and the gate pad electrode 15 are shown by the dotted lines. FIG. 2A shows a sectional structure along the section line X1-X1 of FIG. 1B. FIG. 2B shows a sectional structure along the section line X2-X2 of FIG. 1B. FIG. 2C shows a sectional structure along the section line X3-X3 of FIG. 1B. Herein, a super junction MOSFET 101 is taken as an example of the semiconductor device 100 according to Embodiment 1.

As shown in FIG. 1A, the super junction MOSFET 101 includes a gate pad electrode 15 formed from a metal (for example, Al (aluminum)-Si (silicon)), and a source electrode 14 formed from a metal (for example, Al—Si), on the front surface of the super junction semiconductor substrate 1. The gate pad electrode 15 is disposed, for example, on the chip outer peripheral side of an active region. The source electrode 14 is disposed substantially all over the active region except in the portion in which is disposed the gate pad electrode 15, and surrounds, for example, three sides of the substantially rectangular gate pad electrode 15. A gate runner 15a disposed so as to enclose the perimeter of the source electrode 14 is connected to the gate pad electrode 15. A breakdown voltage terminal structure portion is disposed in the outermost periphery (chip outermost periphery) of the super junction MOSFET 101.

As shown in FIG. 1B, the pn parallel columns 4, wherein p columns 2 and n columns 3 are alternately disposed, are disposed in the super junction semiconductor substrate 1 from immediately below the source electrode 14 to immediately below the gate pad electrode 15. The p columns 2 and the n columns 3 are disposed in a plan view layout of stripes. p channel regions (second-conductivity-type channel regions) 5 are disposed, on the pn parallel columns 4, immediately below the source electrode 14. A plurality of the p channel regions 5 are disposed, for example, in a plan view layout of stripes parallel to a direction in which the pn parallel columns 4 extend in stripes. n source regions 6 and a p contact region 9 are disposed, inside each p channel region 5, in a plan view layout of straight lines parallel to a direction (hereafter referred to as a first direction (a long direction)) in which the p channel regions 5 extend in stripes.

The p well regions (second-conductivity-type well regions) 16 are disposed on the pn parallel columns 4, in a plan view layout of stripes parallel to the first direction, immediately below the gate pad electrode 15. p high concentration regions (second-conductivity-type high concentration regions) 17 are disposed, one inside each p well region 16, in a plan view layout of straight lines parallel to the first direction. The p well regions 16 and p high concentration regions 17 immediately below the gate pad electrode 15 are linked (electrically connected) to the p channel regions 5 and p contact regions 9 immediately below the source electrode 14, via extension portions (first and second second-conductivity-type extension regions) 5a and 9a, respectively. That is, the p well regions 16 and the p high concentration regions 17 are disposed in a plan view layout of stripes continuous with the respective p channel regions 5 and p contact regions 9.

The extension portions 5a are portions of the p channel regions 5 extending on the gate pad electrode 15 side and parallel to the first direction. The extension portions 9a are portions of the p contact regions 9 extending on the gate pad electrode 15 side and parallel to the first direction. The respective extension portions 5a and 9a of the p channel regions 5 and p contact regions 9 are disposed, in a plan view layout of stripes parallel to the first direction, immediately below the portion between the gate pad electrode 15 and the source electrode 14. In FIG. 1B, the portion between the gate pad electrode 15 and the source electrode 14 is the portion sandwiched between the dotted line indicating the outer periphery of the gate pad electrode 15 and the dotted line indicating the outer periphery of the source electrode 14.

FIG. 2A shows a sectional structure along the section line X1-X1 which sections the gate pad electrode 15 of FIG. 1B in a direction (the lateral direction of the drawing) perpendicular to one side of the gate pad electrode 15 which is not opposed to the source electrode 14. As shown in FIG. 2A, the pn parallel columns 4, wherein the p columns (second-conductivity-type columns) 2 and the n columns (first-conductivity-type columns) 3 are alternately disposed, are disposed as a drift layer, on a first n layer (a first first-conductivity-type semiconductor layer) 1a (on a surface on the opposite side to the side of an n drain region (a first-conductivity-type drain region) 10 to be described hereafter), immediately below the gate pad electrode 15 (on the pn parallel column 4 side). A second n layer (a second first-conductivity-type semiconductor layer) 1b is disposed on the pn parallel column 4. The p well regions 16 which pass through the second n layer 1b and reach the p columns 2 of the pn parallel columns 4 are disposed in positions inside the second n layer 1b opposite in a depth direction to the respective p columns 2 of the pn parallel columns 4. Adjacent p well regions 16 are separately disposed so as not to make contact with each other.

The p high concentration regions 17, higher in impurity concentration than the p well regions 16, are each selectively disposed, in a surface layer on the substrate front surface side, inside the p well region 16. The p well regions 16 have the function of maintaining a breakdown voltage immediately below the gate pad electrode 15. Polysilicon gate electrodes (second gate electrodes) 8a are each disposed via a gate oxide film 7 so as to extend between the p high concentration regions 17 disposed in adjacent p well regions 16. The interlayer insulating film 12 is disposed on the surfaces of the polysilicon gate electrodes 8a, and over surfaces of the p well regions 16 and p high concentration regions 17 exposed between the polysilicon gate electrodes 8a. The gate pad electrode 15 is disposed on the surface of the interlayer insulating film 12.

The polysilicon gate electrodes 8a are electrically connected to the gate pad electrode 15 by wires omitted from the illustration. The n drain region 10 is disposed in a surface layer of the first n layer 1a opposite to the pn parallel column 4 side. The super junction semiconductor substrate 1 is formed by stacking the n drain region 10, first n layer 1a, pn parallel columns 4, and second n layer 1b in order from the drain side. A drain electrode 11 is disposed connected to the n drain region 10. A pn junction 23 is formed at the interface (in the portion shown by the thick line) between the p region of the p well region 16 and p column 2 and the n region of the second n layer 1b, n column 3, and first n layer 1a. A body diode 21 is configured of the p high concentration regions 17, p well regions 16, p columns 2, first n layer 1a, and n drain region 10.

FIG. 2B shows a sectional structure along the section line X2-X2 which sections the portion between the gate pad electrode 15 and source electrode 14 of FIG. 1B parallel to the section line X1-X1. As shown in FIG. 2B, the pn parallel columns 4 and the second n layer 1b are disposed in order, on the first n layer 1a, immediately below the portion between the gate pad electrode 15 and the source electrode 14, in the same way as immediately below the gate pad electrode 15. The extension portions 5a which pass through the second n layer 1b and reach the p columns 2 are disposed in positions inside the second n layer 1b opposite in the depth direction to the p columns 2 of the pn parallel columns 4. The extension portions 9a are each selectively disposed, in a surface layer on the substrate front surface side, inside the extension portion 5a.

Polysilicon gate electrodes (third gate electrodes) 8b are each disposed via the gate oxide film 7 so as to extend between the extension portions 9a disposed in adjacent extension portions 5a. The interlayer insulating film 12 is disposed on the surfaces of the polysilicon gate electrodes 8b, and over surfaces of the extension portions 5a of the p channel regions 5 and the extension portions 9a of the p contact regions 9, exposed between the polysilicon gate electrodes 8b. The n drain region 10 and the drain electrode 11 are disposed on the side of the first n layer 1a opposite to the pn parallel column 4 side, in the same way as immediately below the gate pad electrode 15.

The interlayer insulating film 12 is exposed between the gate pad electrode 15 and the source electrode 14. That is, the gate pad electrode 15 and the source electrode 14 are not formed on portions of the interlayer insulating film 12 covering the polysilicon gate electrodes 8b. A pn junction 22 is formed at the interface (in the portion shown by the thick line) between the p region of the extension portion 5a of the p channel region 5 and the p column 2 and the n region of the second n layer 1b, n column 3, and first n layer 1a. The body diode 21 is configured of the extension portions 9a of the p contact regions 9, the extension portions 5a of the p channel regions 5, the p columns 2, the first n layer 1a, and the n drain region 10.

FIG. 2C shows a sectional structure along the section line X3-X3 which sections a portion on the chip outer peripheral side of the source electrode 14 of FIG. 1B parallel to the section line X1-X1. As shown in FIG. 2C, the pn parallel columns 4 and the second n layer 1b are disposed in order on the first n layer 1a, immediately below the source electrode 14, in the same way as immediately below the gate pad electrode 15. The p channel regions 5 which pass through the second n layer 1b and reach the p columns 2 are disposed in positions inside the second n layer 1b opposite in the depth direction to the p columns 2 of the pn parallel columns 4. The n source regions (first-conductivity-type source regions) 6 and the p contact region (second-conductivity-type contact region) 9 are selectively formed, in a surface layer on the substrate front surface side, inside each p channel region 5.

The p contact regions 9 are each disposed on the inner side of the p channel region 5 relative to the n source regions 6 so as to make contact with the n source regions 6. The impurity concentration of the p contact regions 9 is higher than the impurity concentration of the p channel regions 5.

Polysilicon gate electrodes (first gate electrodes) 8c are each disposed via the gate oxide film 7, on the surfaces of portions of adjacent p channel regions 5, each sandwiched between the n source region 6 and the second n layer 1b, so as to extend between the n source regions 6 disposed in the adjacent p channel regions 5. The interlayer insulating film 12 is disposed on the polysilicon gate electrodes 8c. The source electrode 14 is disposed on the surface of the interlayer insulating film 12. Contact holes 13 are formed in the interlayer insulating film 12, and the p contact regions 9 and the n source regions 6 are electrically connected to the source electrode 14 via the contact holes 13.

The n drain region 10 and the drain electrode 11 are disposed on the side of the first n layer 1a opposite to the pn parallel column 4 side, in the same way as immediately below the gate pad electrode 15. The pn junction 22 is formed at the interface (in the portion shown by the thick line) between the p region of the p channel region 5 and p column 2 and the n region of the second n layer 1b, n column 3, and first n layer 1a. The body diode 21 is configured of the p contact regions 9, p channel regions 5, p columns 2, first n layer 1a, and n drain region 10.

The pn parallel column 4 disposed immediately below the gate pad electrode 15, the pn parallel column 4 disposed immediately below the portion between the gate pad electrode 15 and the source electrode 14, and the pn parallel column 4 disposed immediately below the source electrode 14, are integrally formed. The pn parallel columns 4 have a plan view shape of stripes. The p channel regions 5, the extension portions 5a of the p channel regions 5, and the undersurfaces (drain side surfaces) of the p well regions 16 are in contact with the p columns 2 of the pn parallel columns 4. That is, the p channel region 5, the extension portion 5a of the p channel region 5, and the p well region 16 are disposed on each p column 2 (on the source side surface) in a condition in which they are linked in order in a direction in which the p columns 2 extend in stripes. The pn parallel columns 4 are formed by, for example, repeating the combination of epitaxial growth and selective ion implantation a plurality of times.

Also, as shown in FIG. 1B, the p channel regions 5 immediately below the source electrode 14 are linked to the p well regions 16 immediately below the gate pad electrode 15 by the extension portions 5a of the p channel regions 5. Also, the p contact regions 9 immediately below the source electrode 14 are connected to the p high concentration regions 17 immediately below the gate pad electrode 15 by the extension portions 9a of the p contact regions 9. The polysilicon gate electrodes 8a immediately below the gate pad electrode 15 and the polysilicon gate electrodes 8c immediately below the source electrode 14 are electrically connected by the polysilicon gate electrodes 8b.

The p channel regions 5, the extension portions 5a of the p channel regions 5, and the p well regions 16, heretofore described, are formed by ion implantation at the same time using the same mask. The ion implantation may be, for example, such that boron (B) is used as a dopant, and that the dose of boron is on the order of $4\times10^{13}/cm^2$ or more and $7\times10^{13}/cm^2$ or less, and the diffusion depth of these p-type regions is on the order of 3 μm. Also, the p contact regions 9, the extension portions 9a of the p contact regions 9, and the p high concentration regions 17 are formed by ion implantation at the same time using the same mask. The ion implantation may be, for example, such that boron (B) is used as a dopant, and that the dose of boron is on the order of $3\times10^{15}/cm^2$, and the diffusion depth of these p-type regions is on the order of 1 μm. In FIG. 2, the n source regions 6, the p contact regions 9, and the p high concentration regions 17 are schematically illustrated, and the respective diffusion depths of the n source regions 6, p contact regions 9, and p high concentration regions 17 are illustrated as being deep for the sake of convenience.

The n source regions 6 are formed only immediately below the source electrode 14. The reason is as follows. When the n source regions 6 are extended from immediately below the source electrode 14 to immediately below the gate pad electrode 15, the interlayer insulating film 12 are exposed between the source electrode 14 and the gate pad electrode 15, electric charge having intruded from the exterior is stored in the exposed portions of the interlayer insulating film 12, and a gate voltage threshold (Vth) decreases locally. As current becomes liable to flow due to the decrease in the gate voltage threshold (Vth), there is fear that the semiconductor device generates heat, leading to destruction of the semiconductor device.

In FIGS. 1 and 2, a width (a width in a second direction (a short direction) perpendicular to the first direction) W1 of the p well regions 16 and a width W2 of the p high concentration regions 17, immediately below the gate pad electrode 15, are made wider respectively than a width W3 of the p channel regions 5 and a width W4 of the p contact regions 9, immediately below the source electrode 14 (W1>W3 and W2>W4). By so doing, it is possible to reduce resistance R of the current path of a current (a hole flow) I flowing into the source electrode 14 by way of the p well regions 16 and p high concentration regions 17, and thus possible to reduce a voltage V generated by the resistance R. The resistance R of the combination of the p well regions 16 and p high concentration regions 17 is one or more digits smaller than the resistance of the p columns 2. Therefore, it is possible to prevent breakdown, in a portion of the gate oxide film 7 immediately below the gate pad electrode 15, which is generated in a reverse recovery process of the body diode 21.

In the heretofore described current path of the current I, resistance (hereafter referred to as current path resistance) Ro of the portion from immediately below the center of the gate pad electrode 15 to the gate pad electrode 15 side end portion of the contact hole 13 has mainly the resistance R of the combination of the p well region 16 and p high concentration region 17. The reason is that as the length (the width in the first direction) of the extension portions 5a and 9a of the p channel region 5 and p contact region 9 immediately below the portion between the source electrode 14 and the gate pad electrode 15 is short, and the resistance value in this portion is very small, the resistance value can be ignored. Also, the resistance R of the combination of the p well region 16 and p high concentration region 17 decreases substantially in inverse proportion to the size of the width W1 of the p well region 16 and of the width W2 of the p high concentration region 17. When a current (hereafter referred to as a current immediately below the gate pad electrode 15) I flowing into the source electrode 14 by way of the p well region 16 and p high concentration region 17 is fixed, the voltage V, which is the product of the current I and resistance R, also decreases substantially in inverse proportion to the size of the width W1 of the p well region 16 and of the width W2 of the p high concentration region 17.

Figure 11A:
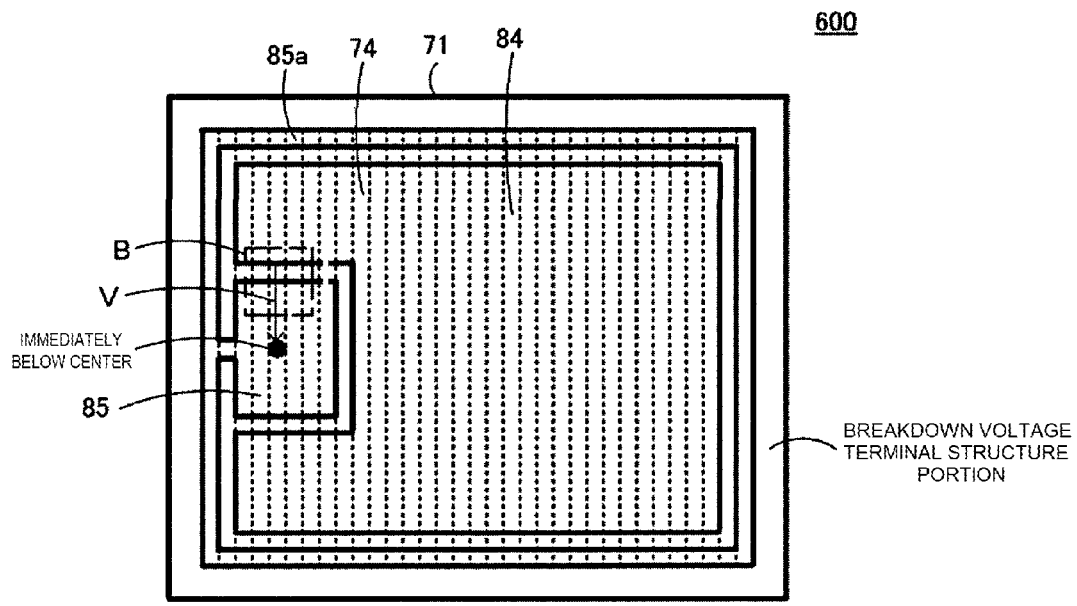
FIG. 11 includes FIGS. 11A and 11B which illustrate plan views showing a configuration of a heretofore known super junction MOSFET 600.
Figure 11B:
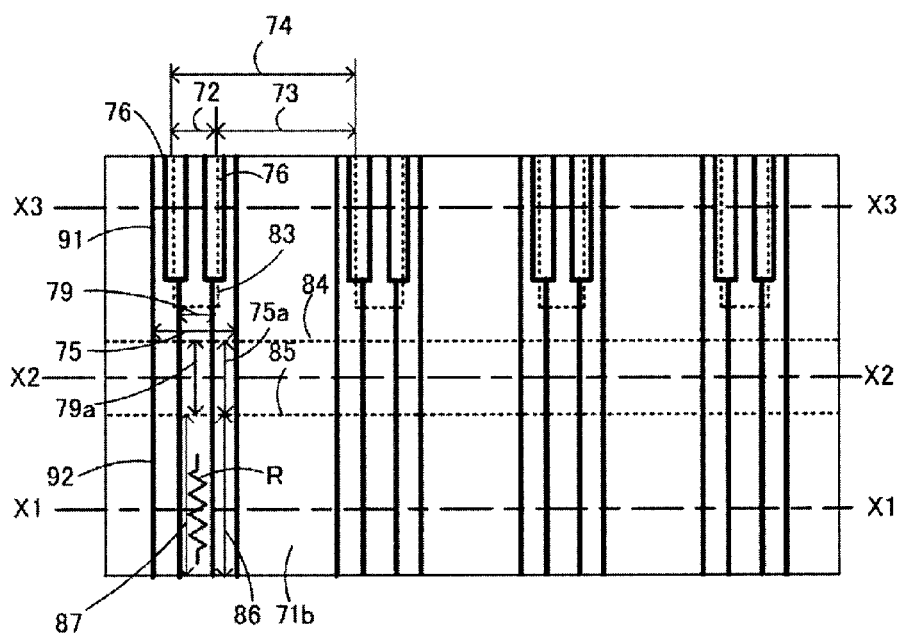
Figure 12A:
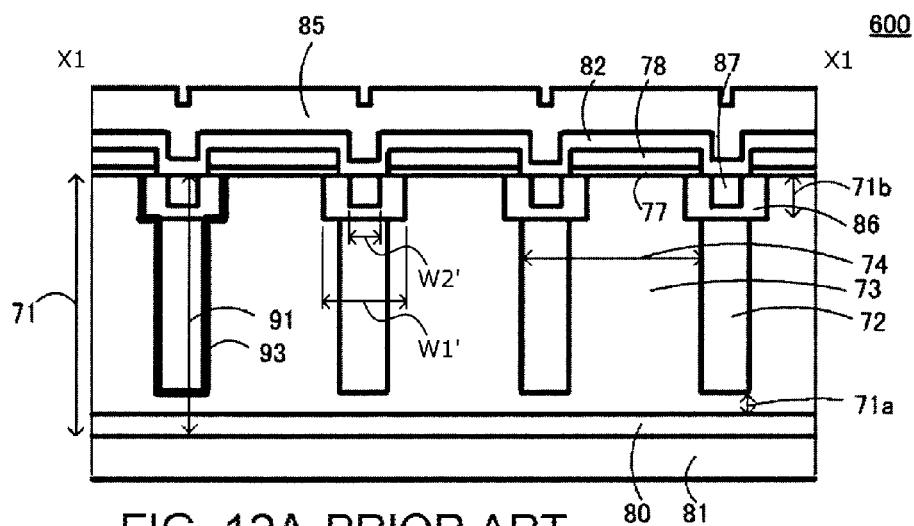
FIG. 12 includes FIGS. 12A, 12B, and 12C which illustrate sectional views showing sectional structures along the section line X1-X1, section line X2-X2, and section line X3-X3 of FIG. 11B.
Figure 12B:
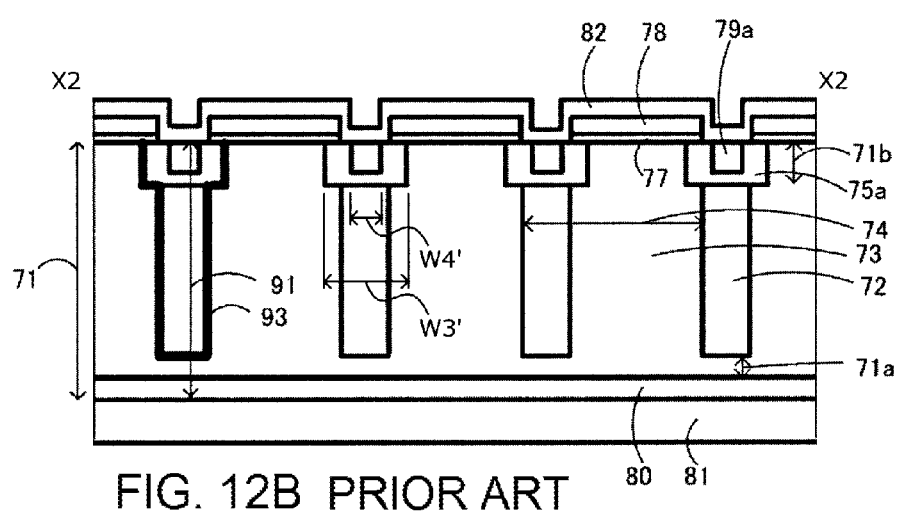
Figure 12C:
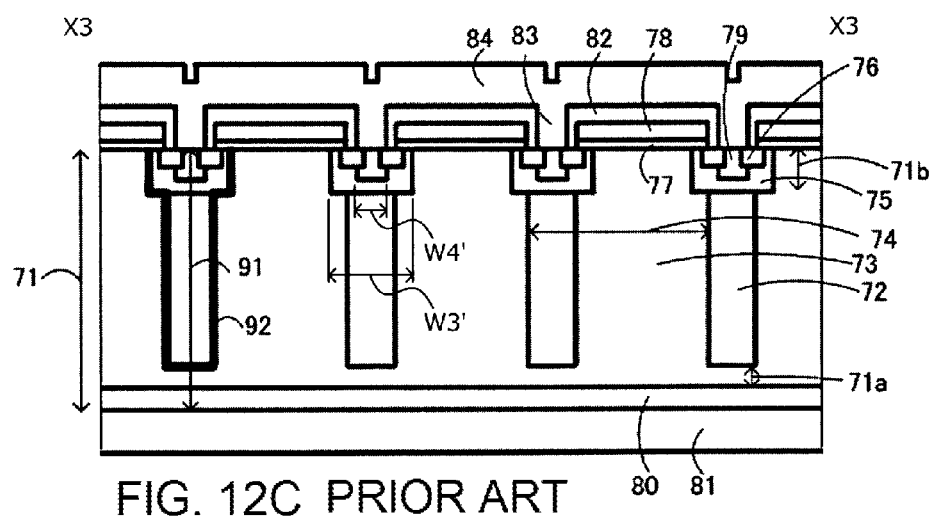
Figure 13A:
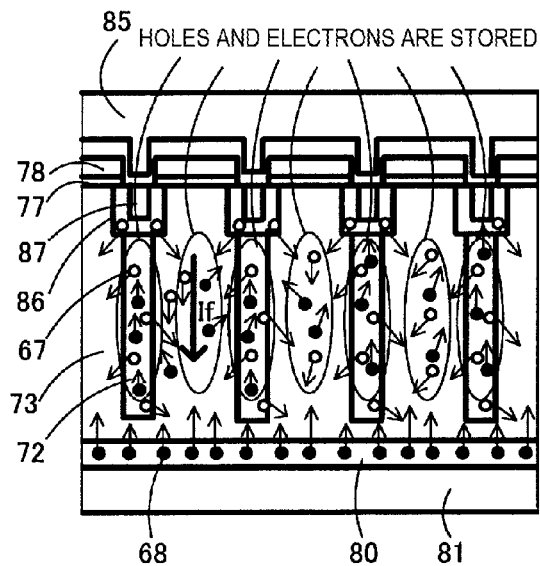
FIG. 13 includes FIGS. 13A, 13B, 13C, and 13D which illustrate explanatory diagrams showing a reverse recovery operation of a body diode 91 of the super junction MOSFET 600 of FIG. 12.
Figure 13B:
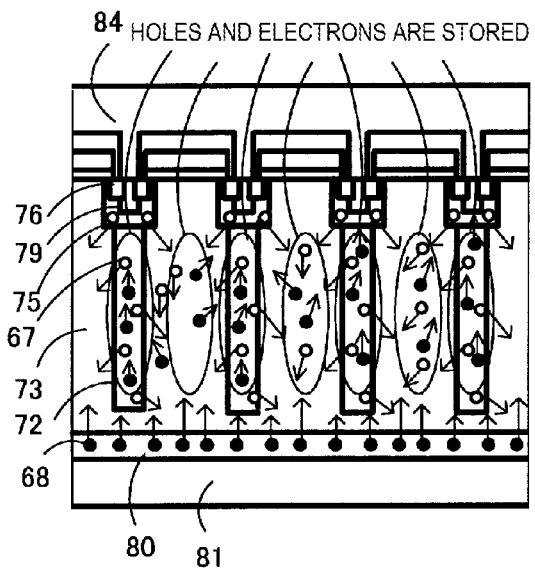
Figure 13C:
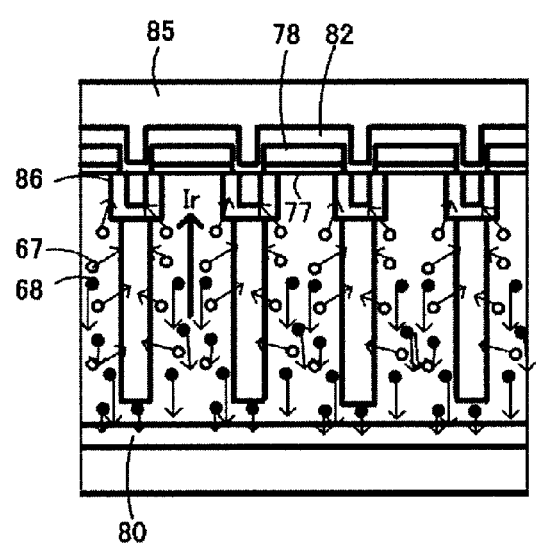
Figure 13D:
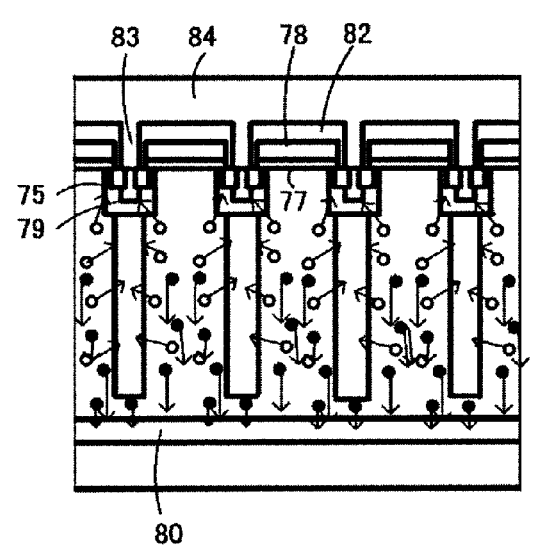

Specifically, for example, when the width W1 of the p well regions 16 is set to on the order of 12 μm, the width W3 of the p channel regions 5 is set to on the order of 8 μm, the width W2 of the p high concentration regions 17 is set to on the order of 6 μm, and the width W4 of the p contact regions 9 is set to on the order of 4 μm, the resistance (current path resistance) Ro of the portion from immediately below the center of the gate pad electrode 15 to the gate pad electrode 15 side end portion of the contact hole 13 can be reduced by on the order of 30%, compared with the same portion of a heretofore known structure (a width W1' of p well regions 86=8 μm, and a width W2' of p high concentration regions 87=4 μm). The heretofore known structure is a super junction MOSFET 600 wherein the width W1' of the p well regions 86 and the width W2' of the high concentration regions 87, immediately below a gate pad electrode 85, are equal respectively to a width W3' of p channel regions 75 and a width W4' of p contact regions 79, immediately below a source electrode 84 (W1'=W3' and W2'=W4': refer to FIGS. 11 and 12).

Consequently, it is possible to reduce by on the order of 30% a voltage (hereafter referred to as a voltage immediately below the center of the gate pad electrode 15) Vo generated in a portion of the p well region 16 immediately below the center of the gate pad electrode 15 by a reverse recovery current of the body diode 21, and thus possible to prevent breakdown of the portion of the gate oxide film 7 immediately below the gate pad electrode 15. As a result of this, it is possible to prevent short circuit of the gate and source of the super junction MOSFET 101. The voltage Vo immediately below the center of the gate pad electrode 15 is a voltage having the potential in the end portion of the contact hole 13 as a reference.

In the case of using the polysilicon gate electrode 8a and polysilicon gate electrode 8c as a mask when forming the p well regions 16 and p channel regions 5, the width W5 of the polysilicon gate electrodes 8a immediately below the gate pad electrode 15 is made narrower than a width W6 of the polysilicon gate electrodes 8c immediately below the source electrode 14 (W5<W6). By so doing, the width W1 of the p well regions 16 and the width W2 of the p high concentration regions 17, immediately below the gate pad electrode 15, can be made wider respectively than the width W3 of the p channel regions 5 and the width W4 of the p contact regions 9, immediately below the source electrode 14. Also, the width W2 of the p high concentration regions 17 and the width W4 of the p contact regions 9 may be set to substantially the same width (W2=W4) although the reduction in the voltage Vo immediately below the center of the gate pad electrode 15 is small in this case.

Figure 3:
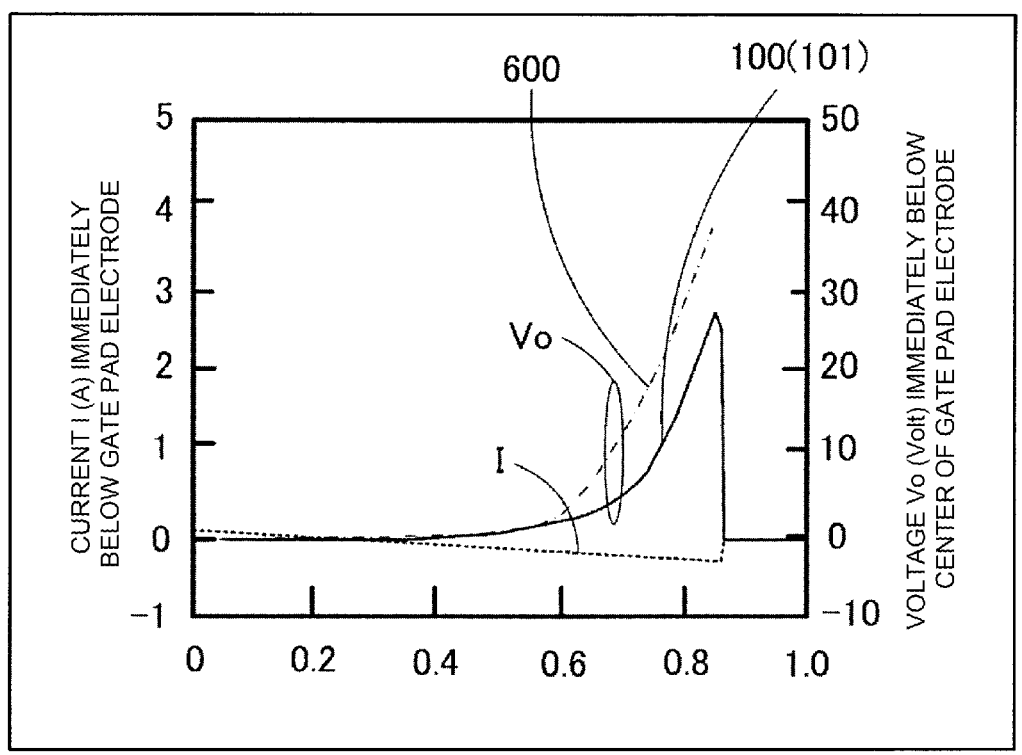
FIG. 3 is a characteristic diagram showing a result of simulating waveforms of a voltage Vo immediately below the center of a gate pad electrode 15 and a current I immediately below the gate pad electrode 15, with respect to a lapse of time, in a reverse recovery process of a body diode 21.

Next, a verification is given of the voltage Vo immediately below the center of the gate pad electrode 15 of the super junction MOSFET 101 according to the heretofore described Embodiment 1. FIG. 3 is a characteristic diagram showing a result of simulating waveforms of the voltage Vo (the potential of the p well region) immediately below the gate pad electrode 15 and the current I immediately below the gate pad electrode 15, with respect to a lapse of time, in the reverse recovery process of the body diode 21. The simulation is carried on a unit cell (a portion formed of the p well region 16, the extension portion 5a of the p channel region 5, the p channel region 5 and p high concentration region 17, the extension region 9a of the p contact region 9, the p contact region 9, and the pn parallel column 4). The length (the width in the first direction) of the p well region 16 immediately below the gate pad electrode 15 is set to on the order of 1 mm, and the length from the center to either end of the p well region 16 is set to on the order of 500 μm. The dot-and-dash line in FIG. 3 indicates the heretofore known super junction MOSFET 600, and the solid line indicates the super junction MOSFET 101 according to Embodiment 1 of the invention.

As shown in FIG. 3, it is confirmed that the voltage Vo immediately below the center of the gate pad electrode 15 of the structure of the invention (the solid line) decreases by on the order of 30% compared with in the heretofore known structure (the dot-and-dash line), and that it is possible to prevent breakdown of the gate oxide film 7. In the invention, the p well regions 16 are disposed separately from one another, and the width W1 of the p well regions 16 is made wider than the width W3 of the p channel regions 5, thereby enabling a reduction in the current path resistance Ro. Therefore, even when impurity concentration varies from one p well region 16 to another, it is possible to prevent the gate oxide film 7 from coming to breakdown in the portion immediately below the center of the gate pad electrode 15.

As heretofore described, according to Embodiment 1, by making the width of the p well regions immediately below the gate pad electrode wider than the width of the p channel regions immediately below the source electrode, it is possible to reduce the voltage applied to the portion of the p well region, immediately below the center of the gate pad electrode, which becomes highest in voltage in the reverse recovery process of the body diode. Therefore, as it is possible to reduce the voltage applied to the gate insulating film immediately below the gate pad electrode, it is possible to prevent the gate oxide film 7 from coming to breakdown.

Embodiment 2

Figure 4:
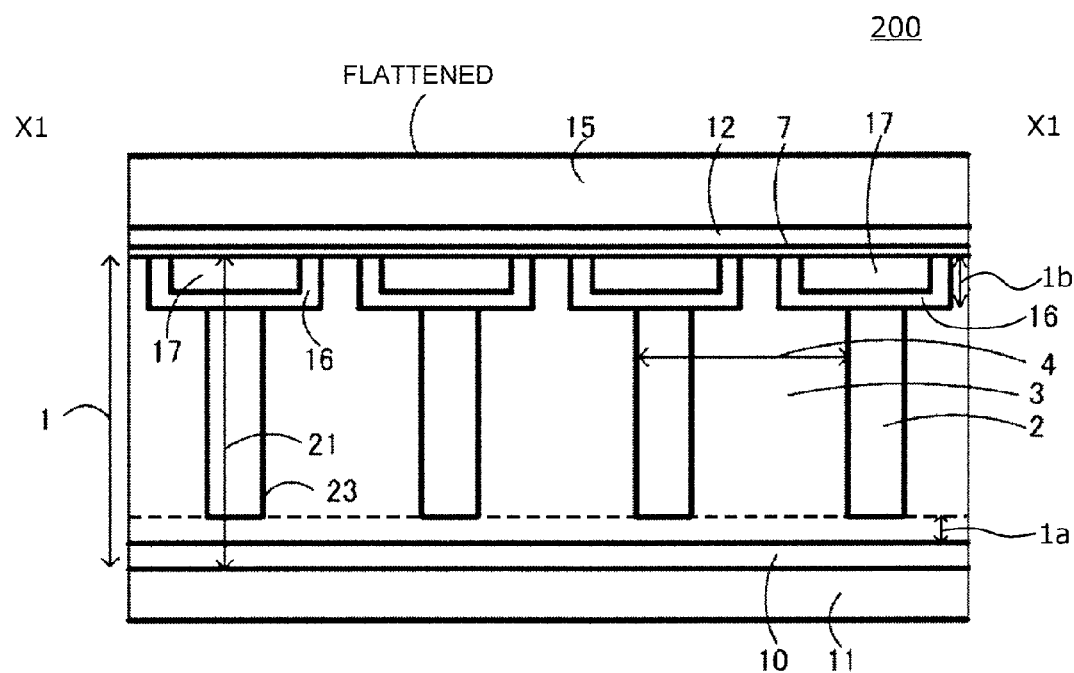
FIG. 4 is a sectional view showing a configuration of a semiconductor device 200 according to Embodiment 2 of the invention.

Next, a description will be given of a configuration of a semiconductor device according to Embodiment 2. FIG. 4 is a sectional view showing a configuration of a semiconductor device 200 according to Embodiment 2 of the invention. The plan view layout of the semiconductor device 200 according to Embodiment 2 is the same as that of the semiconductor device (FIG. 1) according to Embodiment 1. FIG. 4 shows a sectional structure along the section line X1-X1 of FIG. 1B. FIG. 4 is a modification example of the sectional structure shown in FIG. 2A. The semiconductor device according to Embodiment 2 is different from the semiconductor device according to Embodiment 1 in including no polysilicon gate electrode 8a immediately below the gate pad electrode 15.

In Embodiment 2, the p well regions 16 cannot be formed with the polysilicon gate electrode 8a as a mask, but as there is no polysilicon gate electrode 8a immediately below the gate pad electrode 15, it does not happen that the gate oxide film 7 suffers breakdown even when the voltage of the p well regions 16 rises. Also, as there is no polysilicon gate electrode 8a immediately below the gate pad electrode 15, no undulation due to the polysilicon gate electrodes 8a occurs immediately below the gate pad electrode 15, and the surface of the gate pad electrode 15 is flattened. Therefore, it is possible to successfully carry out ultrasonic bonding of wires connected to the gate pad electrode 15. For example, a new photoresist mask only has to be used in forming the p well regions 16.

Also, a configuration may be such as not to provide the polysilicon gate electrode 8b immediately below the portion between the gate pad electrode 15 and the source electrode 14. A configuration may also be such as not to include the gate oxide film 7 immediately below the gate pad electrode 15. Also, a configuration may also be such as not to include the gate oxide film 7 immediately below the portion between the gate pad electrode 15 and the source electrode 14 when providing no polysilicon gate electrode 8b immediately below the portion between the gate pad electrode 15 and the source electrode 14.

As heretofore described, according to Embodiment 2, it is possible to obtain the same advantageous effects as in Embodiment 1.

Embodiment 3

Figure 5:
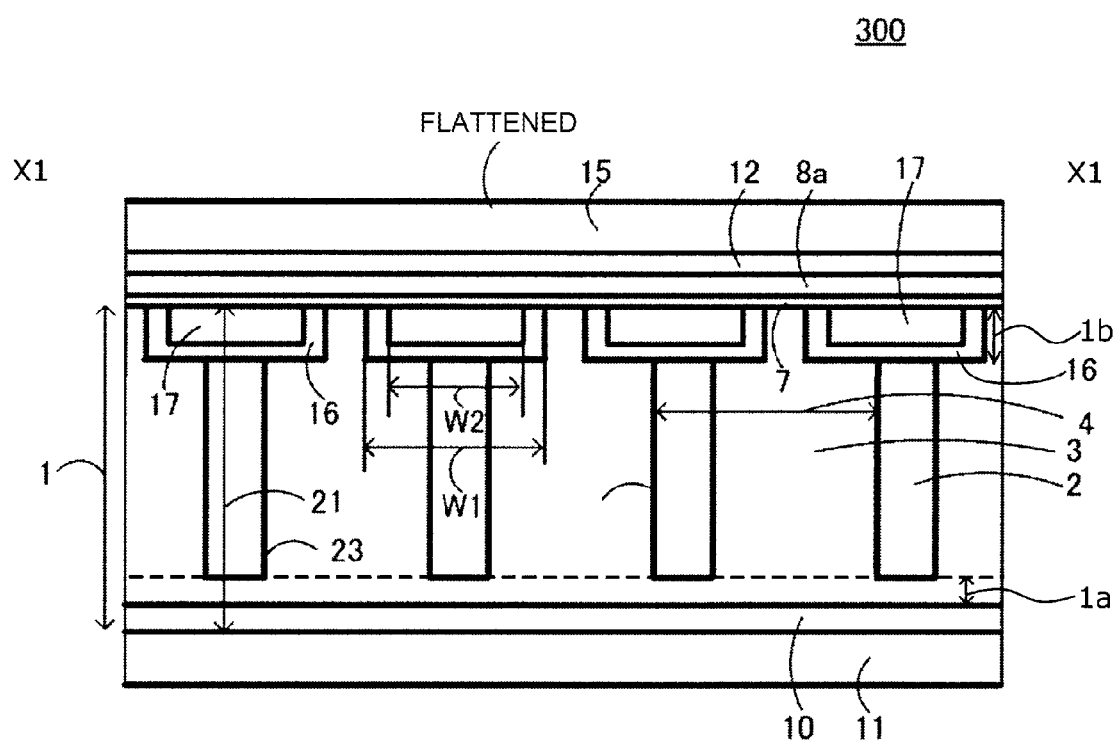
FIG. 5 is a sectional view showing a configuration of a semiconductor device 300 according to Embodiment 3 of the invention.

Next, a description will be given of a configuration of a semiconductor device according to Embodiment 3. FIG. 5 is a sectional view showing a configuration of a semiconductor device 300 according to Embodiment 3 of the invention. The plan view layout of the semiconductor device 300 according to Embodiment 3 is the same as that of the semiconductor device (FIG. 1) according to Embodiment 1. FIG. 5 shows a sectional structure along the section line X1-X1 of FIG. 1B. FIG. 5 is a modification example of the sectional structure shown in FIG. 2A. The semiconductor device according to Embodiment 3 is different from the semiconductor device according to Embodiment 1 in that the polysilicon gate electrode 8a immediately below the gate pad electrode 15 is made the same in size (surface area) as the gate pad electrode 15.

In Embodiment 3, one polysilicon gate electrode 8a is disposed throughout a plurality of unit cells all over immediately below the gate pad electrode 15. In this case, as no undulation due to the polysilicon gate electrodes 8a occurs immediately below the gate pad electrode 15 although the p well regions 16 cannot be formed with the polysilicon gate electrode 8a as a mask, the surface of the gate pad electrode 15 is flattened. Therefore, it is possible to successfully carry out ultrasonic bonding of wires connected to the gate pad electrode 15. A new photoresist mask or the like only has to be used in forming the p well regions 16, in the same way as in Embodiment 2.

As heretofore described, according to Embodiment 3, it is possible to obtain the same advantageous effects as in Embodiment 1.

Embodiment 4

Figure 6A:
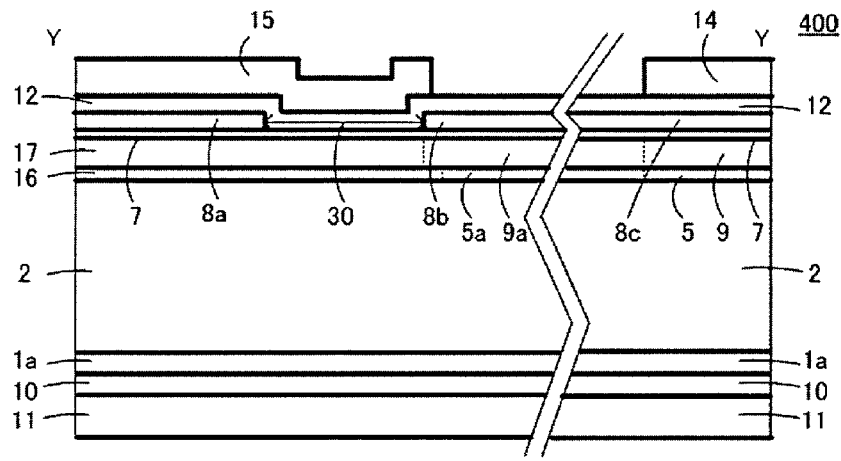
FIG. 6 includes FIGS. 6A, 6B, and 6C which illustrate sectional views showing a configuration of a semiconductor device 400 according to Embodiment 4 of the invention.
Figure 6B:
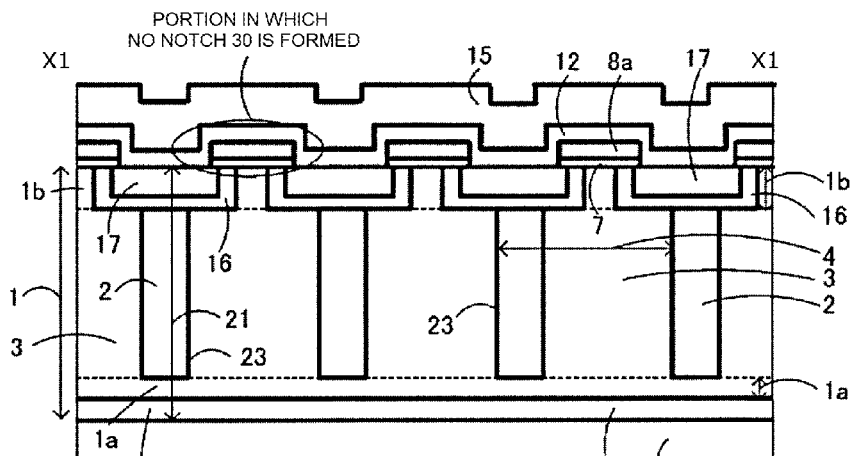
Figure 6C:
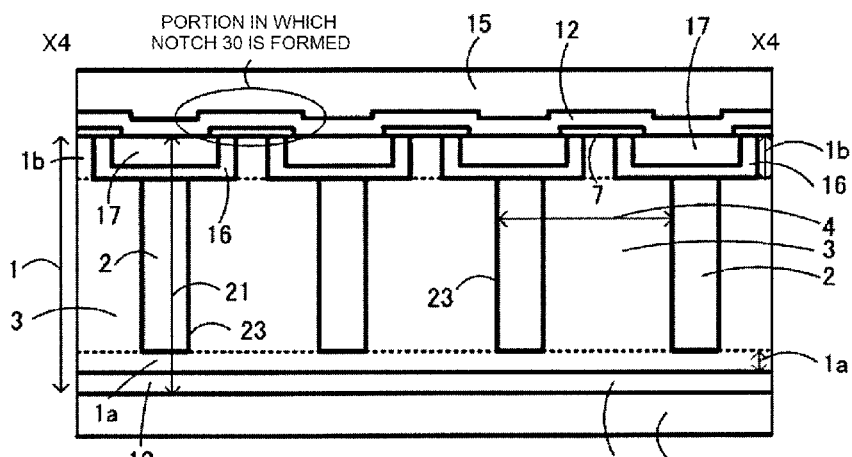

Next, a description will be given of a configuration of a semiconductor device according to Embodiment 4. FIG. 6 illustrates sectional views showing a configuration of a semiconductor device 400 according to Embodiment 4 of the invention. The plan view layout of the semiconductor device 400 according to Embodiment 4 is the same as that of the semiconductor device (FIG. 1) according to Embodiment 1. FIG. 6 shows sectional structures along the section line X4-X4 and section line Y-Y of FIG. 1B. FIG. 6A shows a sectional structure along the section line Y-Y of FIG. 1B. FIG. 6B shows a sectional structure along the section line X1-X1 of FIG. 1B. FIG. 6C shows a sectional structure along the section line X4-X4 of FIG. 1B. The semiconductor device according to Embodiment 4 is different from the semiconductor device according to Embodiment 1 in that the polysilicon gate electrode 8c disposed immediately below the source electrode 14 is electrically separated from the polysilicon gate electrode 8a disposed immediately below the gate pad electrode 15.

For example, as shown in FIG. 6A, by forming a notch 30 in the polysilicon gate electrode 8a immediately below the outer peripheral portion of the gate pad electrode 15, the polysilicon gate electrode 8c disposed immediately below the source electrode 14 is electrically separated from the polysilicon gate electrode 8a disposed immediately below the gate pad electrode 15. The notch 30 is a portion, for example, on the order of several μm in length, which has no polysilicon gate electrode 8a. The length of the notch 30 can be variously changed. By forming the notch 30, the polysilicon gate electrode 8a immediately below the gate pad electrode 15 keeps a floating potential. Therefore, as no voltage is applied to the gate oxide film 7 even when the voltage of the p well region 16 disposed immediately below the gate pad electrode 15 rises, the gate oxide film 7 does not break down.

As shown in FIG. 6B, the polysilicon gate electrode 8a is disposed in a portion, immediately below the gate pad electrode 15, in which no notch 30 is formed, in the same way as in Embodiment 1 (FIG. 2A). Meanwhile, as shown in FIG. 6C, no polysilicon gate electrode 8a is disposed in the portion in which the notch 30 is formed, thereby flattening the interlayer insulating film 12. In FIG. 6, a description is given, as an example, of the case in which the notch 30 is formed in the polysilicon gate electrode 8a on the p well regions 16, but the polysilicon gate electrode 8c and the polysilicon gate electrode 8a only have to be electrically separated, and a notch may be formed in the polysilicon gate electrode 8c immediately below the portion between the gate pad electrode 15 and the source electrode 14.

Also, by applying Embodiment 3, one polysilicon gate electrode 8a of the same size as the gate pad electrode 15 may be disposed all over immediately below the gate pad electrode 15.

As heretofore described, according to Embodiment 4, it is possible to obtain the same advantageous effects as in Embodiment 1.

Figure 7A:
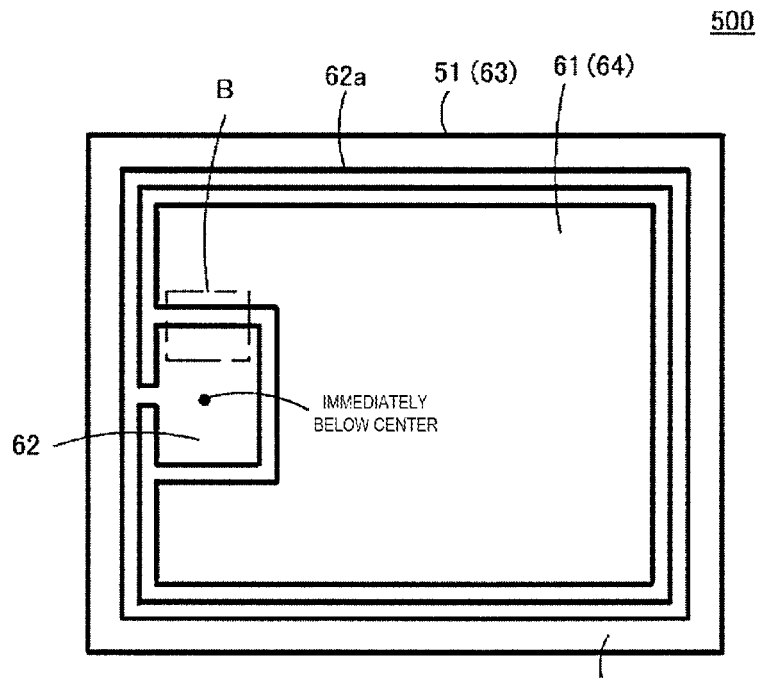
FIG. 7 includes FIGS. 7A and 7B which illustrate plan views showing a configuration of a heretofore known planar gate MOSFET 500.
Figure 7B:
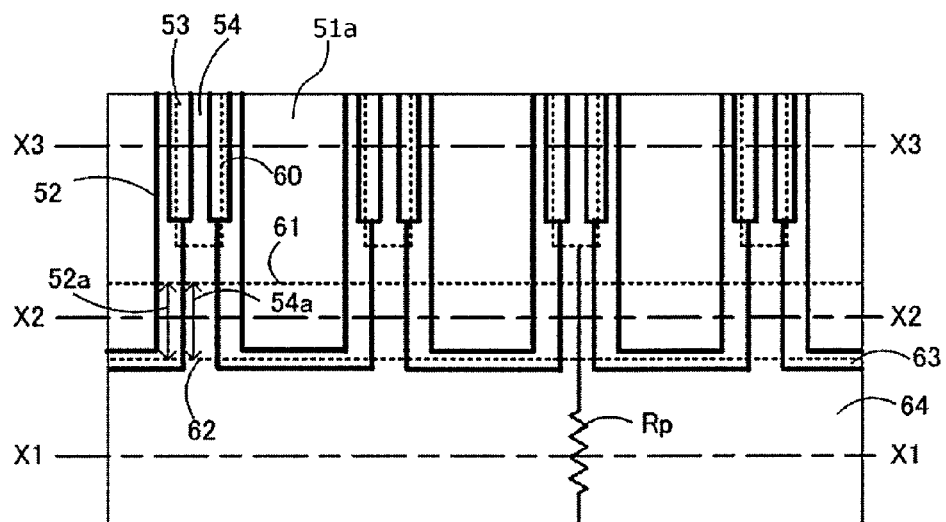
Figure 8A:
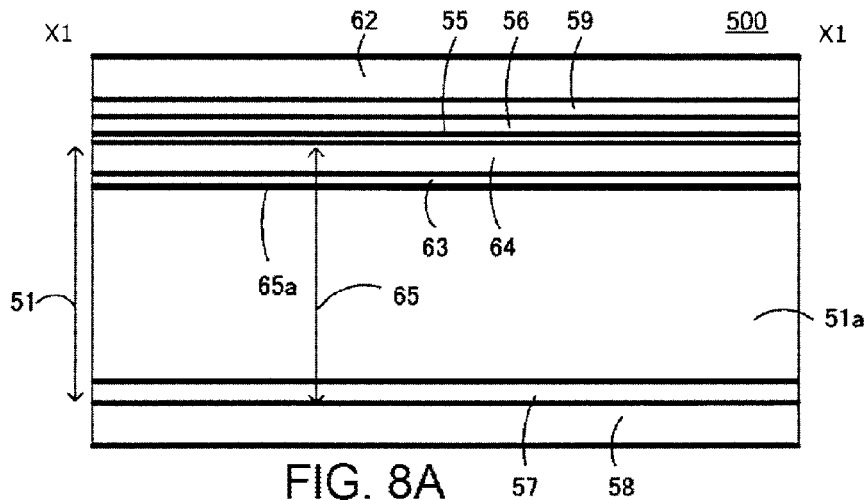
FIG. 8 includes FIGS. 8A, 8B, and 8C which illustrate sectional views showing sectional structures along the section line X1-X1, section line X2-X2, and section line X3-X3 of FIG. 7B.
Figure 8B:
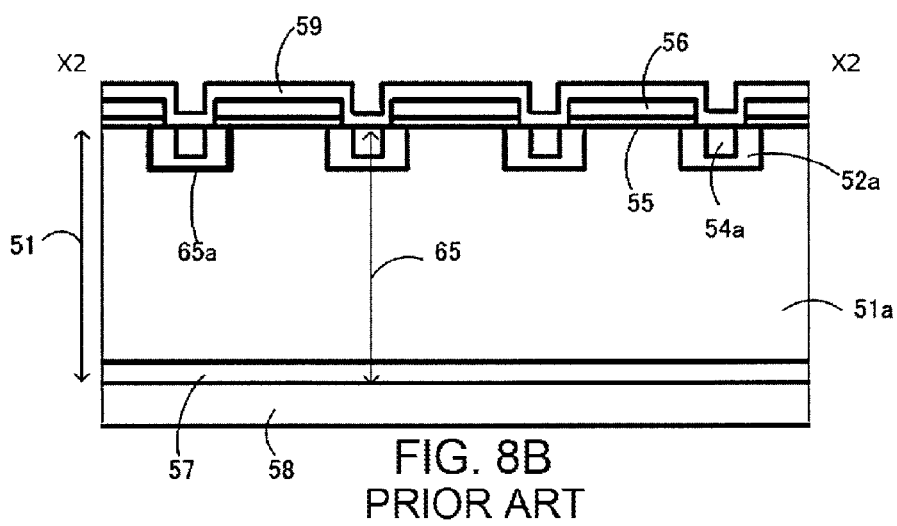
Figure 8C:
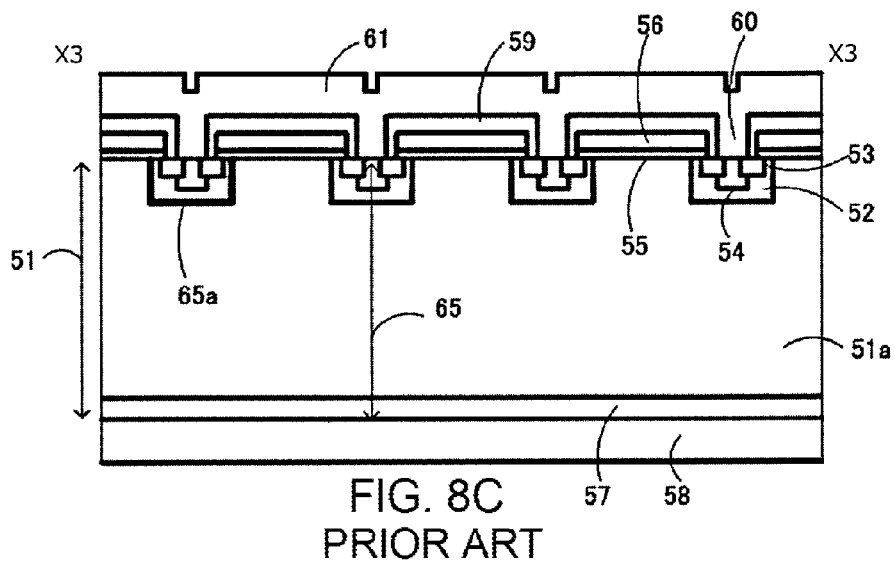
Figure 9A:
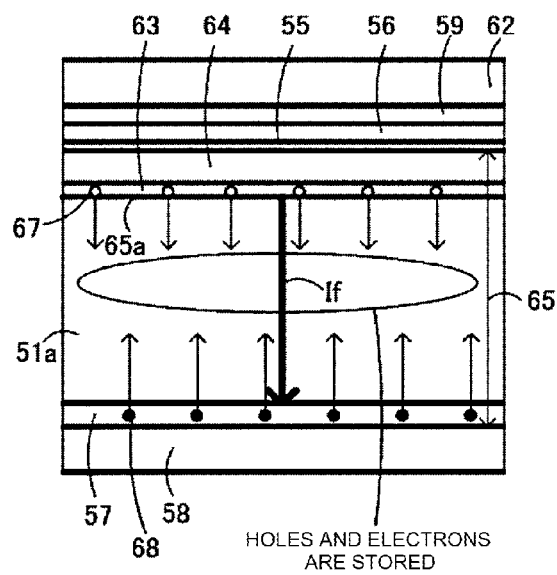
FIG. 9 includes FIGS. 9A, 9B, 9C, and 9D which illustrate explanatory diagrams showing a reverse recovery operation of a body diode 65 of the planar gate MOSFET 500 of FIG. 8.
Figure 9B:
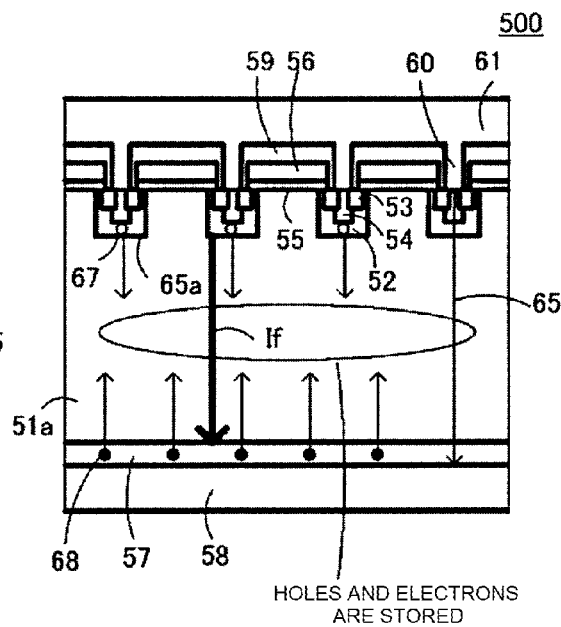
Figure 9C:
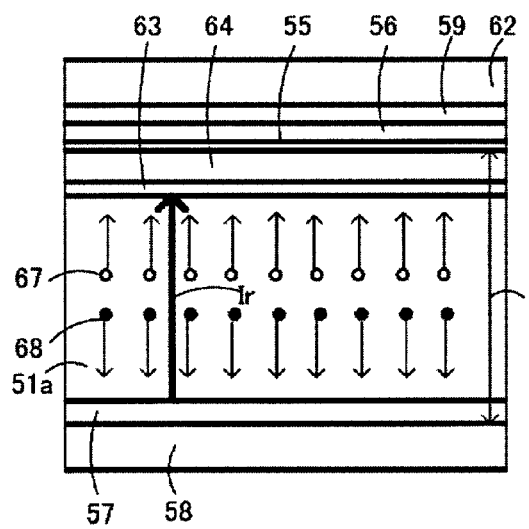
Figure 9D:
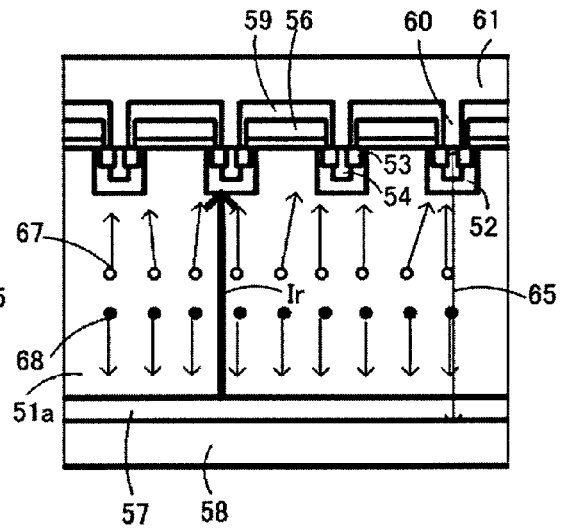
Figure 10:
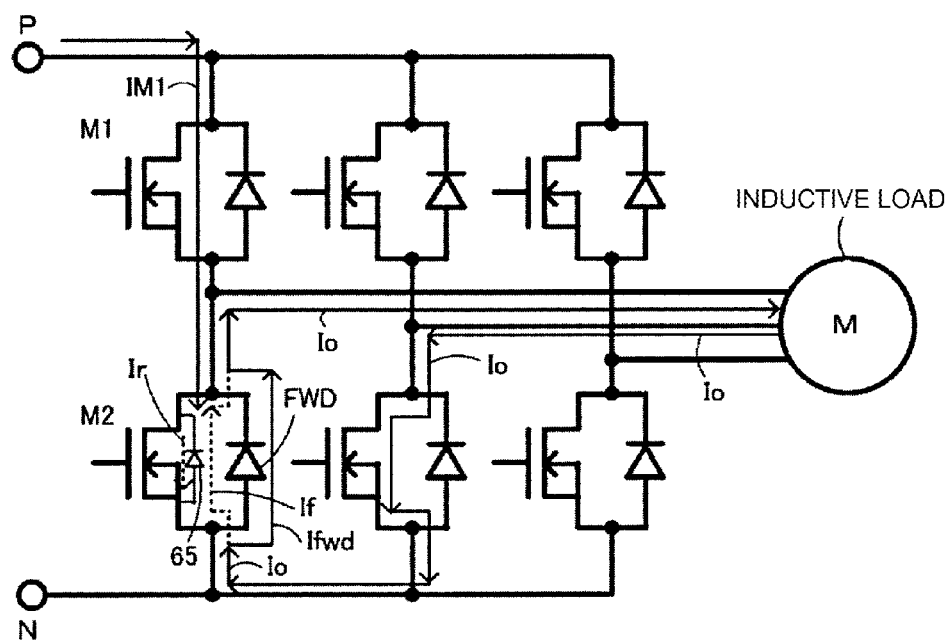
FIG. 10 is an explanatory diagram showing an operation of an inverter circuit to which an inductive load M is connected.

In the above, the invention, not being limited to the heretofore described embodiments, can be variously modified without departing from the scope of the invention. For example, in each heretofore described embodiment, a description is given with a super junction MOSFET as an example, but the invention can also be applied to a planar gate MOSFET such as shown in FIGS. 7 and 8, a super junction IGBT, or a planar gate IGBT. Also, in each heretofore described embodiment, a description is given, as an example, of the case in which the long direction (the direction in which the pn parallel columns extend in stripes) of the pn parallel columns is parallel to the long direction (the direction in which the p channel regions extend in stripes) of the p channel regions, but the long direction of the pn parallel columns may be perpendicular to the long direction of the second-conductivity-type channel regions. Also, in each embodiment, the first-conductivity-type is n-type and the second-conductivity-type is p-type, but the invention holds true in the same way even when the first-conductivity-type is p-type and the second-conductivity-type is n-type.

As in the above, the semiconductor device according to the invention is useful for a MOS semiconductor device such as a super junction MOS transistor.

ELEMENT NUMERAL LIST

1 Super junction semiconductor substrate
1a First n layer
1b Second n layer
2 p column
3 n column
4 pn parallel column
5 p channel region
5a, 9a Extension portions
6 n source region
7 Gate oxide film
8, 8a, 8b, 8c Polysilicon gate electrodes
9 p contact region 10 n drain region
11 Drain electrode
12 Interlayer insulating film
13 Contact hole
14 Source electrode
15 Gate pad electrode
16 p well region
17 p high concentration region
21 Body diode
22, 23 pn junction
30 Notch
100, 200, 300, 400 Semiconductor devices
101 Super junction MOSFET
W1 Width of p well region
W2 Width of p high concentration region
W3 Width of p channel region
W4 Width of p contact region
W5 Width of polysilicon gate electrode immediately below gate pad electrode
W6 Width of polysilicon gate electrode immediately below source electrode

What is claimed is:

1. A semiconductor device, comprising:
a first first-conductivity-type semiconductor layer;
pn parallel columns wherein first-conductivity-type columns and second-conductivity-type columns are alternately disposed on a first principal surface of the first first-conductivity-type semiconductor layer in a plan view layout of stripes extending in a direction horizontal to the first principal surface of the first first-conductivity-type semiconductor layer;
a second first-conductivity-type semiconductor layer disposed on surfaces of the pn parallel columns opposite to the first first-conductivity-type semiconductor layer side;
second-conductivity-type channel regions disposed inside the second first-conductivity-type semiconductor layer in a plan view layout of stripes extending in the direction horizontal to the first principal surface of the first first-conductivity-type semiconductor layer, and passing through the second first-conductivity-type semiconductor layer in a depth direction and making contact with the second-conductivity-type columns;
second-conductivity-type well regions disposed inside the second first-conductivity-type semiconductor layer in a plan view layout of stripes extending parallel to a first direction in which the second-conductivity-type channel regions extend in stripes, and passing through the second first-conductivity-type semiconductor layer in the depth direction and making contact with the second-conductivity-type columns, and one end portion in the first direction of each of which is linked to one end portion in the first direction of the second-conductivity-type channel region;
first-conductivity-type source regions disposed inside each second-conductivity-type channel region;
second-conductivity-type contact regions that each make contact with the first-conductivity-type source regions, and that are disposed in a plan view shape of straight lines extending in the first direction, one on the inner side of the first-conductivity-type source regions inside each second-conductivity-type channel region;
second-conductivity-type high concentration regions disposed one inside each second-conductivity-type well region in a plan view shape of straight lines extending in the first direction, and one end portion in the first direction of each of which is linked to one end portion in the first direction of the second-conductivity-type contact region;
first gate electrodes which are each disposed via a gate insulating film, over the second first-conductivity-type semiconductor layer, and on the surfaces of portions of the second-conductivity-type channel regions, each sandwiched between the first-conductivity-type source region and the second first-conductivity-type semiconductor layer;
an interlayer insulating film disposed on the surfaces of the first gate electrodes;
a source electrode disposed on the interlayer insulating film and connected to the second-conductivity-type channel regions and the first-conductivity-type source regions via contact holes provided in the interlayer insulating film;
a gate pad electrode electrically connected to the first gate electrodes and disposed, separately from the source electrode, in a position on the interlayer insulating film opposite to the second-conductivity-type well regions and the second-conductivity-type high concentration regions with the interlayer insulating film sandwiched in between;
a first-conductivity-type drain region disposed on a second principal surface of the first first-conductivity-type semiconductor layer; and
a drain electrode connected to the first-conductivity-type drain region,
wherein the second-conductivity-type well regions have a width in a second direction which is perpendicular to the first direction, that is wider than that of the second-conductivity-type channel regions in the second direction.

2. The semiconductor device according to claim 1, further comprising:
second gate electrodes which are each disposed, via the gate insulating film, on the surface of a portion of the second-conductivity-type well regions and the second first-conductivity-type semiconductor layer sandwiched between adjacent second-conductivity-type high concentration regions; and
the interlayer insulating film being disposed on the surfaces of the second gate electrodes.

3. The semiconductor device according to claim 2, further comprising:
between the source electrode and the gate pad electrode,
first second-conductivity-type extension regions, each formed of a portion of the second-conductivity-type channel region extended in the first direction, which pass through the second first-conductivity-type semiconductor layer in the depth direction and make contact with the second-conductivity-type columns, and which link the second-conductivity-type channel regions and the second-conductivity-type well regions by each making contact with one end portion in the first direction of the second-conductivity-type well region;
second second-conductivity-type extension regions, wherein a portion of the second-conductivity-type contact region extended in the first direction is disposed inside each first second-conductivity-type extension region, which, each making contact with one end portion in the first direction of the second-conductivity-type high concentration region, and link the second-conductivity-type contact regions and second-conductivity-type high concentration regions;

third gate electrodes which are each disposed, via the gate insulating film, on the surface of a portion of the first second-conductivity-type extension regions and the second first-conductivity-type semiconductor layer sandwiched between adjacent second second-conductivity-type extension regions; and the interlayer insulating film being disposed on the surfaces of the third gate electrodes, wherein the third gate electrodes link the first gate electrodes and second gate electrodes.

4. The semiconductor device according to claim 2, wherein the second gate electrode has a width in the second direction that is narrower than that of the first gate electrodes in the second direction.

5. The semiconductor device according to claim 2, wherein the second gate electrode is disposed in the whole portion opposite to the gate pad electrode with the interlayer insulating film sandwiched in between.

6. The semiconductor device according to claim 2, wherein the second gate electrode is electrically isolated from the first gate electrode.

7. The semiconductor device according to claim 2, wherein the pn parallel columns are such that the first-conductivity-type columns and the second-conductivity-type columns are alternately disposed in a plan view shape of stripes parallel to the first direction.

8. The semiconductor device according to claim 3, wherein the second gate electrode has a width in the second direction that is narrower than that of the first gate electrodes in the second direction.

9. The semiconductor device according to claim 3, wherein the second gate electrode is disposed in the whole portion opposite to the gate pad electrode with the interlayer insulating film sandwiched in between.

10. The semiconductor device according to claim 1, wherein the second-conductivity-type high concentration regions has a width in the second direction that is wider than that of the second-conductivity-type contact regions in the second direction.

11. The semiconductor device according to claim 1, wherein the pn parallel columns are such that the first-conductivity-type columns and the second-conductivity-type columns are alternately disposed in a plan view shape of stripes parallel to the first direction.

12. A semiconductor device, comprising:
second-conductivity-type channel regions disposed in a surface layer on a first principal surface of a first-conductivity-type drift layer in a plan view layout of stripes extending in a direction horizontal to the first principal surface on the first-conductivity-type drift layer;
second-conductivity-type well regions disposed in the surface layer of the first principal surface of the first-conductivity-type drift layer in a plan view layout of stripes extending parallel to a first direction in which the second-conductivity-type channel regions extend in stripes, and one end portion in the first direction of each of which is linked to one end portion in the first direction of the second-conductivity-type channel region;
first-conductivity-type source regions disposed inside each second-conductivity-type channel region;
second-conductivity-type contact regions, each making contact with the first-conductivity-type source regions, which are disposed, in a plan view shape of straight lines extending in the first direction, one on the inner side of the first-conductivity-type source regions inside each second-conductivity-type channel region;
second-conductivity-type high concentration regions which are disposed one inside each second-conductivity-type well region in a plan view shape of straight lines extending in the first direction, and one end portion in the first direction of each of which is linked to one end portion in the first direction of the second-conductivity-type contact region;
first gate electrodes which are each disposed, via a gate insulating film, on the surfaces of portions of the second-conductivity-type channel regions, each sandwiched between the first-conductivity-type source region and the first-conductivity-type drift layer;
an interlayer insulating film disposed on the surfaces of the first gate electrodes;
a source electrode disposed on the interlayer insulating film, and connected to the second-conductivity-type channel regions and the first-conductivity-type source regions via contact holes provided in the interlayer insulating film;
a gate pad electrode electrically connected to the first gate electrodes and disposed, separately from the source electrode, in a position on the interlayer insulating film opposite to the second-conductivity-type well regions and the second-conductivity-type high concentration regions with the interlayer insulating film sandwiched in between;
a first-conductivity-type drain region disposed on a second principal surface of the first-conductivity-type drift layer; and
a drain electrode connected to the first-conductivity-type drain region,
wherein the second-conductivity-type well regions have a width in a second direction, which is perpendicular to the first direction, that is wider than that of the second-conductivity-type channel regions in the second direction.

13. The semiconductor device according to claim 12, further comprising:
second gate electrodes which are each disposed, via the gate insulating film, on the surface of a portion of the second-conductivity-type well regions and the first-conductivity-type drift layer sandwiched between adjacent second-conductivity-type high concentration regions; and
the interlayer insulating film being disposed on the surfaces of the second gate electrodes.

14. The semiconductor device according to claim 13, further comprising:
between the source electrode and the gate pad electrode,
first second-conductivity-type extension regions, each of which is formed of a portion of the second-conductivity-type channel region extended in the first direction, makes contact with one end portion in the first direction of the second-conductivity-type well region and links the second-conductivity-type channel region and second-conductivity-type well region;
second second-conductivity-type extension regions, wherein a portion of the second-conductivity-type contact region extended in the first direction is disposed inside each first second-conductivity-type extension region, each of which makes contact with one end portion in the first direction of the second-conductivity-type high concentration region and links the second-conductivity-type contact region and the second-conductivity-type high concentration region;

third electrodes which are each disposed, via the gate insulating film, on the surface of a portion of the first second-conductivity-type extension regions and the first-conductivity-type drift layer sandwiched between adjacent second second-conductivity-type extension regions; and the interlayer insulating film being disposed on the surfaces of the third gate electrodes, wherein the third gate electrodes link the first gate electrodes and the second gate electrodes.

15. The semiconductor device according to claim 13, wherein the second gate electrode has a width in the second direction that is narrower than that of the first gate electrodes in the second direction.

16. The semiconductor device according to claim 13, wherein the second gate electrode is disposed in the whole portion opposite to the gate pad electrode with the interlayer insulating film sandwiched in between.

17. The semiconductor device according to claim 13, wherein the second gate electrode is electrically isolated from the first gate electrode.

18. The semiconductor device according to claim 14, wherein the second gate electrode has a width in the second direction that is narrower than that of the first gate electrodes in the second direction.

19. The semiconductor device according to claim 14, wherein the second gate electrode is disposed in the whole portion opposite to the gate pad electrode with the interlayer insulating film sandwiched in between.

20. The semiconductor device according to claim 12, wherein the second-conductivity-type high concentration regions has a width in the second direction that is wider than that of the second-conductivity-type contact regions in the second direction.

* * * * *